United States Patent
Arango et al.

(10) Patent No.: US 8,305,341 B2
(45) Date of Patent: *Nov. 6, 2012

(54) DIELECTROPHORETIC DISPLAYS

(75) Inventors: Alexi C. Arango, Somerville, MA (US); Joseph M. Jacobson, Newton Centre, MA (US); Karl R. Amundson, Cambridge, MA (US)

(73) Assignee: E Ink Corporation, Cambridge, MA (US)

( * ) Notice: Subject to any disclaimer, the term of this patent is extended or adjusted under 35 U.S.C. 154(b) by 359 days.

This patent is subject to a terminal disclaimer.

(21) Appl. No.: 12/549,763

(22) Filed: Aug. 28, 2009

(65) Prior Publication Data

US 2010/0045592 A1    Feb. 25, 2010

Related U.S. Application Data

(63) Continuation of application No. 11/799,377, filed on May 1, 2007, now Pat. No. 7,583,251, which is a continuation-in-part of application No. 10/687,166, filed on Oct. 16, 2003, now Pat. No. 7,259,744, and a continuation-in-part of application No. 08/983,404, filed as application No. PCT/US96/12000 on Jul. 19, 1996, now Pat. No. 7,106,296, which is a continuation-in-part of application No. 08/504,896, filed on Jul. 20, 1995, now Pat. No. 6,124,851.

(60) Provisional application No. 60/419,019, filed on Oct. 16, 2002.

(51) Int. Cl.
*G09G 3/34* (2006.01)

(52) U.S. Cl. ..................................... 345/107

(58) Field of Classification Search .................. 345/107
See application file for complete search history.

(56) References Cited

U.S. PATENT DOCUMENTS

| | | |
|---|---|---|
| 3,036,388 A | 5/1962 | Tate |
| 3,406,363 A | 10/1968 | Tate |
| 3,460,248 A | 8/1969 | Tate |
| 3,617,374 A | 11/1971 | Hodson et al. |
| 3,668,106 A | 6/1972 | Ota |
| 3,697,150 A | 10/1972 | Wysocki |
| 3,756,693 A | 9/1973 | Ota |
| 3,767,392 A | 10/1973 | Ota |
| 3,792,308 A | 2/1974 | Ota |

(Continued)

FOREIGN PATENT DOCUMENTS

EP        0 281 204 A2    9/1988

(Continued)

OTHER PUBLICATIONS

Ackerman, "E Ink of Cambridge gets start-up funding", Boston Globe, Dec. 24, 1997, p. D4.

(Continued)

*Primary Examiner* — Adam R Giesy
(74) *Attorney, Agent, or Firm* — David J. Cole

(57) ABSTRACT

A dielectrophoretic display comprises a substrate having walls defining at least one cavity, the cavity having a viewing surface and a side wall inclined to the viewing surface; a suspending fluid contained within the cavity; a plurality of at least one type of particle suspended within the suspending fluid; and means for applying to the fluid an electric field effective to cause dielectrophoretic movement of the particles to the side wall of the cavity.

26 Claims, 7 Drawing Sheets

U.S. PATENT DOCUMENTS

| | | | |
|---|---|---|---|
| 3,806,893 A | 4/1974 | Ohnishi et al. | |
| 3,850,627 A | 11/1974 | Wells et al. | |
| 3,870,517 A | 3/1975 | Ota et al. | |
| 3,892,568 A | 7/1975 | Ota | |
| 3,960,439 A | 6/1976 | Becker et al. | |
| 4,041,481 A | 8/1977 | Sato | |
| 4,045,327 A | 8/1977 | Noma et al. | |
| 4,068,927 A | 1/1978 | White | |
| 4,071,430 A | 1/1978 | Liebert | |
| 4,088,395 A | 5/1978 | Giglia | |
| 4,123,346 A | 10/1978 | Ploix | |
| 4,126,854 A | 11/1978 | Sheridon | |
| 4,143,103 A | 3/1979 | Sheridon | |
| 4,203,106 A | 5/1980 | Dalisa et al. | |
| 4,218,302 A | 8/1980 | Dalisa et al. | |
| 4,231,641 A | 11/1980 | Randin | |
| 4,261,653 A | 4/1981 | Goodrich | |
| 4,345,249 A | 8/1982 | Togashi | |
| 4,368,952 A | 1/1983 | Murata et al. | |
| 4,390,403 A | 6/1983 | Batchelder | |
| 4,402,062 A | 8/1983 | Batchelder | |
| 4,411,495 A | 10/1983 | Beni et al. | |
| 4,418,346 A * | 11/1983 | Batchelder | 345/107 |
| 4,419,383 A | 12/1983 | Lee | |
| 4,430,648 A | 2/1984 | Togashi et al. | |
| 4,435,047 A | 3/1984 | Fergason | |
| 4,438,160 A | 3/1984 | Ishikawa et al. | |
| 4,450,440 A | 5/1984 | White | |
| 4,509,828 A | 4/1985 | Clerc et al. | |
| 4,522,472 A | 6/1985 | Liebert et al. | |
| 4,643,528 A | 2/1987 | Bell, Jr. | |
| 4,648,956 A | 3/1987 | Marshall et al. | |
| 4,703,573 A | 11/1987 | Montgomery et al. | |
| 4,741,604 A | 5/1988 | Kornfeld | |
| 4,776,675 A | 10/1988 | Takaochi et al. | |
| 4,947,159 A | 8/1990 | DiSanto et al. | |
| 4,948,232 A | 8/1990 | Lange | |
| 5,105,185 A | 4/1992 | Nakanowatari et al. | |
| 5,109,354 A | 4/1992 | Yamashita et al. | |
| 5,167,508 A | 12/1992 | McTaggart | |
| 5,187,609 A | 2/1993 | DiSanto et al. | |
| 5,216,530 A | 6/1993 | Pearlman et al. | |
| 5,220,316 A | 6/1993 | Kazan | |
| 5,223,823 A | 6/1993 | Disanto et al. | |
| 5,250,938 A | 10/1993 | DiSanto et al. | |
| 5,254,981 A | 10/1993 | DiSanto et al. | |
| 5,262,098 A | 11/1993 | Crowley et al. | |
| 5,270,843 A | 12/1993 | Wang | |
| 5,276,438 A | 1/1994 | DiSanto et al. | |
| 5,279,694 A | 1/1994 | DiSanto et al. | |
| 5,293,528 A | 3/1994 | DiSanto et al. | |
| 5,302,235 A | 4/1994 | DiSanto et al. | |
| 5,304,439 A | 4/1994 | Disanto et al. | |
| 5,315,312 A | 5/1994 | DiSanto et al. | |
| 5,316,341 A | 5/1994 | Schwartz | |
| 5,344,594 A | 9/1994 | Sheridon | |
| 5,345,251 A | 9/1994 | DiSanto et al. | |
| 5,357,355 A | 10/1994 | Arai | |
| 5,359,346 A | 10/1994 | DiSanto et al. | |
| 5,377,258 A | 12/1994 | Bro | |
| 5,383,008 A | 1/1995 | Sheridon | |
| 5,389,945 A | 2/1995 | Sheridon | |
| 5,390,026 A | 2/1995 | Lim | |
| 5,398,131 A | 3/1995 | Hall et al. | |
| 5,402,145 A | 3/1995 | DiSanto et al. | |
| 5,407,231 A | 4/1995 | Schwartz | |
| 5,412,398 A | 5/1995 | DiSanto et al. | |
| 5,460,688 A | 10/1995 | DiSanto et al. | |
| 5,467,107 A | 11/1995 | DiSanto et al. | |
| 5,484,292 A | 1/1996 | McTaggart | |
| 5,485,176 A | 1/1996 | Ohara et al. | |
| 5,499,038 A | 3/1996 | DiSanto et al. | |
| 5,508,068 A | 4/1996 | Nakano | |
| 5,508,720 A | 4/1996 | DiSanto et al. | |
| 5,512,162 A | 4/1996 | Sachs et al. | |
| 5,534,888 A | 7/1996 | Lebby et al. | |
| 5,538,430 A | 7/1996 | Smith et al. | |
| 5,561,443 A | 10/1996 | DiSanto et al. | |
| 5,565,885 A | 10/1996 | Tamanoi | |
| 5,573,711 A | 11/1996 | Hou et al. | |
| 5,576,867 A | 11/1996 | Baur et al. | |
| 5,582,700 A * | 12/1996 | Bryning et al. | 204/450 |
| 5,604,027 A | 2/1997 | Sheridon | |
| 5,627,561 A | 5/1997 | Laspina et al. | |
| 5,643,673 A | 7/1997 | Hou | |
| 5,650,872 A | 7/1997 | Saxe et al. | |
| 5,659,330 A | 8/1997 | Sheridon | |
| 5,707,738 A | 1/1998 | Hou | |
| 5,708,525 A | 1/1998 | Sheridon | |
| 5,717,514 A | 2/1998 | Sheridon | |
| 5,717,515 A | 2/1998 | Sheridon | |
| 5,731,792 A | 3/1998 | Sheridon | |
| 5,737,115 A | 4/1998 | Mackinlay et al. | |
| 5,745,094 A | 4/1998 | Gordon, II et al. | |
| 5,760,761 A | 6/1998 | Sheridon | |
| 5,777,782 A | 7/1998 | Sheridon | |
| 5,808,783 A | 9/1998 | Crowley | |
| 5,852,427 A | 12/1998 | Buzak | |
| 5,872,552 A | 2/1999 | Gordon, II et al. | |
| 5,930,026 A | 7/1999 | Jacobson et al. | |
| 5,961,804 A | 10/1999 | Jacobson et al. | |
| 6,017,584 A | 1/2000 | Albert et al. | |
| 6,025,896 A | 2/2000 | Hattori et al. | |
| 6,054,071 A | 4/2000 | Mikkelsen, Jr. | |
| 6,055,091 A | 4/2000 | Sheridon et al. | |
| 6,067,185 A | 5/2000 | Albert et al. | |
| 6,097,531 A | 8/2000 | Sheridon | |
| 6,118,426 A | 9/2000 | Albert et al. | |
| 6,120,588 A | 9/2000 | Jacobson | |
| 6,120,839 A | 9/2000 | Comiskey et al. | |
| 6,124,851 A | 9/2000 | Jacobson | |
| 6,128,124 A | 10/2000 | Silverman | |
| 6,130,773 A | 10/2000 | Jacobson et al. | |
| 6,130,774 A | 10/2000 | Albert et al. | |
| 6,137,467 A | 10/2000 | Sheridon et al. | |
| 6,144,361 A | 11/2000 | Gordon, II et al. | |
| 6,147,791 A | 11/2000 | Sheridon | |
| 6,172,798 B1 | 1/2001 | Albert et al. | |
| 6,177,921 B1 | 1/2001 | Comiskey et al. | |
| 6,184,856 B1 | 2/2001 | Gordon, II et al. | |
| 6,225,971 B1 | 5/2001 | Gordon, II et al. | |
| 6,232,950 B1 | 5/2001 | Albert et al. | |
| 6,241,921 B1 | 6/2001 | Jacobson et al. | |
| 6,249,271 B1 | 6/2001 | Albert et al. | |
| 6,252,564 B1 | 6/2001 | Albert et al. | |
| 6,262,706 B1 | 7/2001 | Albert et al. | |
| 6,262,833 B1 | 7/2001 | Loxley et al. | |
| 6,271,823 B1 | 8/2001 | Gordon, II et al. | |
| 6,300,932 B1 | 10/2001 | Albert | |
| 6,301,038 B1 | 10/2001 | Fitzmaurice et al. | |
| 6,312,304 B1 | 11/2001 | Duthaler et al. | |
| 6,312,971 B1 | 11/2001 | Amundson et al. | |
| 6,323,989 B1 | 11/2001 | Jacobson et al. | |
| 6,327,072 B1 | 12/2001 | Comiskey et al. | |
| 6,330,054 B1 | 12/2001 | Ikami | |
| 6,376,828 B1 | 4/2002 | Comiskey | |
| 6,377,387 B1 | 4/2002 | Duthaler et al. | |
| 6,392,785 B1 | 5/2002 | Albert et al. | |
| 6,392,786 B1 | 5/2002 | Albert | |
| 6,407,763 B1 | 6/2002 | Yamaguchi et al. | |
| 6,413,790 B1 | 7/2002 | Duthaler et al. | |
| 6,422,687 B1 | 7/2002 | Jacobson | |
| 6,445,374 B2 | 9/2002 | Albert et al. | |
| 6,445,489 B1 | 9/2002 | Jacobson et al. | |
| 6,459,418 B1 | 10/2002 | Comiskey et al. | |
| 6,473,072 B1 | 10/2002 | Comiskey et al. | |
| 6,480,182 B2 | 11/2002 | Turner et al. | |
| 6,498,114 B1 | 12/2002 | Amundson et al. | |
| 6,504,524 B1 | 1/2003 | Gates et al. | |
| 6,506,438 B2 | 1/2003 | Duthaler et al. | |
| 6,512,354 B2 | 1/2003 | Jacobson et al. | |
| 6,515,649 B1 | 2/2003 | Albert et al. | |
| 6,518,949 B2 | 2/2003 | Drzaic | |
| 6,521,489 B2 | 2/2003 | Duthaler et al. | |
| 6,531,997 B1 | 3/2003 | Gates et al. | |
| 6,535,197 B1 | 3/2003 | Comiskey et al. | |
| 6,538,801 B2 | 3/2003 | Jacobson et al. | |

| | | |
|---|---|---|
| 6,545,291 B1 | 4/2003 | Amundson et al. |
| 6,580,545 B2 | 6/2003 | Morrison et al. |
| 6,639,578 B1 | 10/2003 | Comiskey et al. |
| 6,652,075 B2 | 11/2003 | Jacobson |
| 6,657,612 B2 | 12/2003 | Machida et al. |
| 6,657,772 B2 | 12/2003 | Loxley |
| 6,664,944 B1 | 12/2003 | Albert et al. |
| D485,294 S | 1/2004 | Albert |
| 6,672,921 B1 | 1/2004 | Liang et al. |
| 6,680,725 B1 | 1/2004 | Jacobson |
| 6,683,333 B2 | 1/2004 | Kazlas et al. |
| 6,693,620 B1 | 2/2004 | Herb et al. |
| 6,704,133 B2 | 3/2004 | Gates et al. |
| 6,710,540 B1 | 3/2004 | Albert et al. |
| 6,721,083 B2 | 4/2004 | Jacobson et al. |
| 6,724,519 B1 | 4/2004 | Comiskey et al. |
| 6,727,881 B1 | 4/2004 | Albert et al. |
| 6,738,039 B2 | 5/2004 | Goden |
| 6,738,050 B2 | 5/2004 | Comiskey et al. |
| 6,750,473 B2 | 6/2004 | Amundson et al. |
| 6,753,999 B2 | 6/2004 | Zehner et al. |
| 6,788,449 B2 | 9/2004 | Liang et al. |
| 6,816,147 B2 | 11/2004 | Albert |
| 6,819,471 B2 | 11/2004 | Amundson et al. |
| 6,822,782 B2 | 11/2004 | Honeyman et al. |
| 6,825,068 B2 | 11/2004 | Denis et al. |
| 6,825,829 B1 | 11/2004 | Albert et al. |
| 6,825,970 B2 | 11/2004 | Goenaga et al. |
| 6,831,769 B2 | 12/2004 | Holman et al. |
| 6,839,158 B2 | 1/2005 | Albert et al. |
| 6,842,167 B2 | 1/2005 | Albert et al. |
| 6,842,279 B2 | 1/2005 | Amundson |
| 6,842,657 B1 | 1/2005 | Drzaic et al. |
| 6,864,875 B2 | 3/2005 | Drzaic et al. |
| 6,865,010 B2 | 3/2005 | Duthaler et al. |
| 6,866,760 B2 | 3/2005 | Paolini Jr. et al. |
| 6,870,657 B1 | 3/2005 | Fitzmaurice et al. |
| 6,870,661 B2 | 3/2005 | Pullen et al. |
| 6,900,851 B2 | 5/2005 | Morrison et al. |
| 6,922,276 B2 | 7/2005 | Zhang et al. |
| 6,950,220 B2 | 9/2005 | Abramson et al. |
| 6,958,848 B2 | 10/2005 | Cao et al. |
| 6,967,640 B2 | 11/2005 | Albert et al. |
| 6,980,196 B1 | 12/2005 | Turner et al. |
| 6,982,178 B2 | 1/2006 | LeCain et al. |
| 6,987,603 B2 | 1/2006 | Paolini, Jr. et al. |
| 6,995,550 B2 | 2/2006 | Jacobson et al. |
| 7,002,728 B2 | 2/2006 | Pullen et al. |
| 7,012,600 B2 | 3/2006 | Zehner et al. |
| 7,012,735 B2 | 3/2006 | Honeyman et al. |
| 7,023,420 B2 | 4/2006 | Comiskey et al. |
| 7,030,412 B1 | 4/2006 | Drzaic et al. |
| 7,030,854 B2 | 4/2006 | Baucom et al. |
| 7,034,783 B2 | 4/2006 | Gates et al. |
| 7,038,655 B2 | 5/2006 | Herb et al. |
| 7,061,663 B2 | 6/2006 | Cao et al. |
| 7,071,913 B2 | 7/2006 | Albert et al. |
| 7,075,502 B1 | 7/2006 | Drzaic et al. |
| 7,075,703 B2 | 7/2006 | O'Neil et al. |
| 7,079,305 B2 | 7/2006 | Paolini, Jr. et al. |
| 7,106,296 B1 | 9/2006 | Jacobson |
| 7,109,968 B2 | 9/2006 | Albert et al. |
| 7,110,163 B2 | 9/2006 | Webber et al. |
| 7,110,164 B2 | 9/2006 | Paolini, Jr. et al. |
| 7,116,318 B2 | 10/2006 | Amundson et al. |
| 7,116,466 B2 | 10/2006 | Whitesides et al. |
| 7,119,759 B2 | 10/2006 | Zehner et al. |
| 7,119,772 B2 | 10/2006 | Amundson et al. |
| 7,148,128 B2 | 12/2006 | Jacobson |
| 7,167,155 B1 | 1/2007 | Albert et al. |
| 7,170,670 B2 | 1/2007 | Webber |
| 7,173,752 B2 | 2/2007 | Doshi et al. |
| 7,176,880 B2 | 2/2007 | Amundson et al. |
| 7,180,649 B2 | 2/2007 | Morrison et al. |
| 7,190,008 B2 | 3/2007 | Amundson et al. |
| 7,193,625 B2 | 3/2007 | Danner et al. |
| 7,202,847 B2 | 4/2007 | Gates |
| 7,202,991 B2 | 4/2007 | Zhang et al. |
| 7,206,119 B2 | 4/2007 | Honeyman et al. |
| 7,223,672 B2 | 5/2007 | Kazlas et al. |
| 7,230,750 B2 | 6/2007 | Whitesides et al. |
| 7,230,751 B2 | 6/2007 | Whitesides et al. |
| 7,236,290 B1 | 6/2007 | Zhang et al. |
| 7,236,291 B2 | 6/2007 | Kaga et al. |
| 7,236,292 B2 | 6/2007 | LeCain et al. |
| 7,242,513 B2 | 7/2007 | Albert et al. |
| 7,247,379 B2 | 7/2007 | Pullen et al. |
| 7,256,766 B2 | 8/2007 | Albert et al. |
| 7,259,744 B2 | 8/2007 | Arango et al. |
| 7,280,094 B2 | 10/2007 | Albert |
| 7,304,634 B2 | 12/2007 | Albert et al. |
| 7,304,787 B2 | 12/2007 | Whitesides et al. |
| 7,312,784 B2 | 12/2007 | Baucom et al. |
| 7,312,794 B2 | 12/2007 | Zehner et al. |
| 7,312,916 B2 | 12/2007 | Pullen et al. |
| 7,321,459 B2 | 1/2008 | Masuda et al. |
| 7,327,511 B2 | 2/2008 | Whitesides et al. |
| 7,339,715 B2 | 3/2008 | Webber et al. |
| 7,349,148 B2 | 3/2008 | Doshi et al. |
| 7,352,353 B2 | 4/2008 | Albert et al. |
| 7,365,394 B2 | 4/2008 | Denis et al. |
| 7,365,733 B2 | 4/2008 | Duthaler et al. |
| 7,375,875 B2 | 5/2008 | Whitesides et al. |
| 7,382,363 B2 | 6/2008 | Albert et al. |
| 7,388,572 B2 | 6/2008 | Duthaler et al. |
| 7,391,555 B2 | 6/2008 | Albert et al. |
| 7,411,719 B2 | 8/2008 | Paolini, Jr. et al. |
| 7,411,720 B2 | 8/2008 | Honeyman et al. |
| 7,420,549 B2 | 9/2008 | Jacobson et al. |
| 7,442,587 B2 | 10/2008 | Amundson et al. |
| 7,443,571 B2 | 10/2008 | LeCain et al. |
| 7,453,445 B2 | 11/2008 | Amundson |
| 2002/0060321 A1 | 5/2002 | Kazlas et al. |
| 2002/0090980 A1 | 7/2002 | Wilcox et al. |
| 2002/0113770 A1 | 8/2002 | Jacobson et al. |
| 2002/0131147 A1 | 9/2002 | Paolini, Jr. et al. |
| 2002/0196207 A1 | 12/2002 | Machida et al. |
| 2003/0035198 A1 | 2/2003 | Liang et al. |
| 2003/0048522 A1 | 3/2003 | Liang et al. |
| 2003/0099027 A1 | 5/2003 | Shigehiro et al. |
| 2003/0102858 A1 | 6/2003 | Jacobson et al. |
| 2004/0105036 A1 | 6/2004 | Danner et al. |
| 2004/0112750 A1 | 6/2004 | Jacobson et al. |
| 2004/0119681 A1 | 6/2004 | Albert et al. |
| 2004/0155857 A1 | 8/2004 | Duthaler et al. |
| 2004/0180476 A1 | 9/2004 | Kazlas et al. |
| 2004/0190114 A1 | 9/2004 | Jacobson et al. |
| 2004/0263947 A1 | 12/2004 | Drzaic et al. |
| 2005/0007336 A1 | 1/2005 | Albert et al. |
| 2005/0012980 A1 | 1/2005 | Wilcox et al. |
| 2005/0024353 A1 | 2/2005 | Amundson et al. |
| 2005/0062714 A1 | 3/2005 | Zehner et al. |
| 2005/0122284 A1 | 6/2005 | Gates et al. |
| 2005/0122306 A1 | 6/2005 | Wilcox et al. |
| 2005/0122563 A1 | 6/2005 | Honeyman et al. |
| 2005/0152018 A1 | 7/2005 | Abramson et al. |
| 2005/0156340 A1 | 7/2005 | Valianatos et al. |
| 2005/0179642 A1 | 8/2005 | Wilcox et al. |
| 2005/0212747 A1 | 9/2005 | Amundson |
| 2005/0253777 A1 | 11/2005 | Zehner et al. |
| 2005/0259068 A1 | 11/2005 | Nihei et al. |
| 2005/0280626 A1 | 12/2005 | Amundson et al. |
| 2006/0038772 A1 | 2/2006 | Amundson et al. |
| 2006/0087479 A1 | 4/2006 | Sakurai et al. |
| 2006/0087489 A1 | 4/2006 | Sakurai et al. |
| 2006/0087718 A1 | 4/2006 | Takagi et al. |
| 2006/0139308 A1 | 6/2006 | Jacobson et al. |
| 2006/0139310 A1 | 6/2006 | Zehner et al. |
| 2006/0139311 A1 | 6/2006 | Zehner et al. |
| 2006/0176267 A1 | 8/2006 | Honeyman et al. |
| 2006/0181492 A1 | 8/2006 | Gates et al. |
| 2006/0181504 A1 | 8/2006 | Kawai |
| 2006/0194619 A1 | 8/2006 | Wilcox et al. |
| 2006/0197737 A1 | 9/2006 | Baucom et al. |
| 2006/0197738 A1 | 9/2006 | Kawai |
| 2006/0202949 A1 | 9/2006 | Danner et al. |
| 2006/0209008 A1 | 9/2006 | Nihei et al. |
| 2006/0214906 A1 | 9/2006 | Kobayashi et al. |

| | | | |
|---|---|---|---|
| 2006/0231401 A1 | 10/2006 | Sakurai et al. | |
| 2006/0232531 A1 | 10/2006 | Amundson et al. | |
| 2006/0238488 A1 | 10/2006 | Nihei et al. | |
| 2006/0263927 A1 | 11/2006 | Sakurai et al. | |
| 2006/0279527 A1 | 12/2006 | Zehner et al. | |
| 2006/0291034 A1 | 12/2006 | Patry et al. | |
| 2007/0013683 A1 | 1/2007 | Zhou et al. | |
| 2007/0035532 A1 | 2/2007 | Amundson et al. | |
| 2007/0035808 A1 | 2/2007 | Amundson et al. | |
| 2007/0052757 A1 | 3/2007 | Jacobson | |
| 2007/0057908 A1 | 3/2007 | Jacobson | |
| 2007/0069247 A1 | 3/2007 | Amundson et al. | |
| 2007/0085818 A1 | 4/2007 | Amundson et al. | |
| 2007/0091417 A1 | 4/2007 | Cao et al. | |
| 2007/0091418 A1 | 4/2007 | Danner et al. | |
| 2007/0097489 A1 | 5/2007 | Doshi et al. | |
| 2007/0103427 A1 | 5/2007 | Zhou et al. | |
| 2007/0109219 A1 | 5/2007 | Whitesides et al. | |
| 2007/0146310 A1 | 6/2007 | Paolini, Jr. et al. | |
| 2007/0152956 A1 | 7/2007 | Danner et al. | |
| 2007/0153361 A1 | 7/2007 | Danner et al. | |
| 2007/0200795 A1 | 8/2007 | Whitesides et al. | |
| 2007/0200874 A1 | 8/2007 | Amundson et al. | |
| 2007/0211002 A1 | 9/2007 | Zehner et al. | |
| 2007/0211331 A1 | 9/2007 | Danner et al. | |
| 2007/0223079 A1 | 9/2007 | Honeyman et al. | |
| 2007/0247697 A1 | 10/2007 | Sohn et al. | |
| 2007/0285385 A1 | 12/2007 | Albert et al. | |
| 2007/0286975 A1 | 12/2007 | Fazel et al. | |
| 2008/0013155 A1 | 1/2008 | Honeyman et al. | |
| 2008/0013156 A1 | 1/2008 | Whitesides et al. | |
| 2008/0023332 A1 | 1/2008 | Webber et al. | |
| 2008/0024429 A1 | 1/2008 | Zehner | |
| 2008/0024482 A1 | 1/2008 | Gates et al. | |
| 2008/0030832 A1 | 2/2008 | Paolini, Jr. et al. | |
| 2008/0043318 A1 | 2/2008 | Whitesides et al. | |
| 2008/0048969 A1 | 2/2008 | Whitesides et al. | |
| 2008/0048970 A1 | 2/2008 | Drzaic et al. | |
| 2008/0054879 A1 | 3/2008 | LeCain et al. | |
| 2008/0057252 A1 | 3/2008 | Danner et al. | |
| 2008/0074730 A1 | 3/2008 | Cao et al. | |
| 2008/0117495 A1 | 5/2008 | Arango et al. | |
| 2008/0129667 A1 | 6/2008 | Zehner et al. | |
| 2008/0130092 A1 | 6/2008 | Whitesides et al. | |
| 2008/0136774 A1 | 6/2008 | Harris et al. | |
| 2008/0137176 A1 | 6/2008 | Isobe et al. | |
| 2008/0150888 A1 | 6/2008 | Albert et al. | |
| 2008/0165122 A1 | 7/2008 | Duthaler et al. | |
| 2008/0174853 A1 | 7/2008 | Danner et al. | |
| 2008/0211764 A1 | 9/2008 | Albert et al. | |
| 2008/0211765 A1 | 9/2008 | Comiskey et al. | |
| 2008/0218839 A1 | 9/2008 | Paolini, Jr. et al. | |
| 2008/0254272 A1 | 10/2008 | Danner et al. | |
| 2008/0264791 A1 | 10/2008 | Paolini, Jr. et al. | |
| 2008/0266245 A1 | 10/2008 | Wilcox et al. | |
| 2008/0266646 A1 | 10/2008 | Wilcox et al. | |
| 2008/0291129 A1 | 11/2008 | Harris et al. | |
| 2008/0299859 A1 | 12/2008 | Paolini, Jr. et al. | |
| 2008/0309350 A1 | 12/2008 | Danner et al. | |
| 2008/0316582 A1 | 12/2008 | Danner et al. | |
| 2009/0000729 A1 | 1/2009 | Danner et al. | |
| 2009/0004442 A1 | 1/2009 | Danner | |

FOREIGN PATENT DOCUMENTS

| | | |
|---|---|---|
| EP | 0 443 571 A2 | 8/1991 |
| EP | 0 618 715 A1 | 10/1994 |
| EP | 1 099 207 B1 | 3/2002 |
| EP | 1 145 072 B1 | 5/2003 |
| JP | 59-098227 A | 6/1984 |
| JP | 62-058222 A | 3/1987 |
| JP | 62-231930 A | 10/1987 |
| JP | 03-053224 A | 3/1991 |
| JP | 03-118196 A | 5/1991 |
| WO | WO 00/36560 | 6/2000 |
| WO | WO 00/38000 | 6/2000 |
| WO | WO 00/67110 | 11/2000 |
| WO | WO 01/07961 | 2/2001 |

OTHER PUBLICATIONS

Amundson, K., "Electrophoretic Imaging Films for Electronic Paper Displays" in Crawford, G. ed. Flexible Flat Panel Displays, John Wiley & Sons, Ltd., Hoboken, NJ: 2005.

Amundson, K., et al., "Flexible, Active-Matrix Display Constructed Using a Microencapsulated Electrophoretic Material and an Organic-Semiconductor-Based Backplane", SID 01 Digest, 160 (Jun. 2001).

Au, J. et al., "Ultra-Thin 3.1-in. Active-Matrix Electronic Ink Display for Mobile Devices", IDW'02, 223 (2002).

Bach, U., et al., "Nanomaterials-Based Electrochromics for Paper-Quality Displays", Adv. Mater, 14(11), 845 (2002).

Ballinger, D.O., "Magnetic recording paper is erasable", Electronics, Mar. 1, 1973, pp. 73-76.

Blazo, S.F., "High Resolution Electrophoretic Display with Photoconductor Addressing", SID Digest 1982, p. 152.

Bohnke et al., "Polymer-Based Solid Electrochromic Cell for Matrix-Addressable Display Devices." J. Electrochem. Soc., 138, 3612 (1991).

Bouchard, A. et al., "High-Resolution Microencapsulated Electrophoretic Display on Silicon", SID 04 Digest, 651 (2004).

Bryce, M.R., "Seeing through synthetic metals", Nature, 335. 12 (1988).

Caillot, E. et al. "Active Matrix Electrophoretic Information Display for High Performance Mobile Devices", IDMC Proceedings (2003).

Chen, Y., et al., "A Conformable Electronic Ink Display using a Foil-Based a-Si TFT Array", SID 01 Digest, 157 (Jun. 2001).

Clarisse, C., et al., "Field-Effect Transistor with Diphthalocyanine Thin Film", Elec. Letters, 24, 675 (1988).

Comiskey, B., et al., "An electrophoretic ink for all-printed reflective electronic displays", Nature, 394, 253 (1998).

Comiskey, B., et al., "Electrophoretic Ink: A Printable Display Material", SID 97 Digest (1997), p. 75.

Dalisa, A.L., "Electrophoretic Display Technology", IEEE Trans. Electron Dev., ED-24, 827 (1977).

Danner, G.M. et al., "Reliability Performance for Microencapsulated Electrophoretic Displays with Simulated Active Matrix Drive", SID 03 Digest, 573 (2003).

Drzaic, P., et al., "A Printed and Rollable Bistable Electronic Display", SID 98 Digest (1998), p. 1131.

Duthaler, G., et al., "Active-Matrix Color Displays Using Electrophoretic Ink and Color Filters", SID 02 Digest, 1374 (2002).

Egashira,. N., et al., "Solid electrochromic cell consisting of Lu-diphthalocyanine and lead fluoride", Proceedings of the SID, 28, 227 (1987).

Gates, H. et al., "A5 Sized Electronic Paper Display for Document Viewing", SID 05 Digest, (2005).

Gutcho, M.H., Microcapsules and MIcroencapsulation Techniques, Noyes Data Corp., Park Ridge NJ, (1976).

Hatano, T., et al., "18:3: Bistable Paper-White Display Device Using Cholesteric Liquid Crystals", SID 96 Digest, 269 (1996).

Henzen, A. et al., "An Electronic Ink Low Latency Drawing Tablet", SID 04 Digest, 1070 (2004).

Henzen, A. et al., "Development of Active Matrix Electronic Ink Displays for Handheld Devices", SID 03 Digest, 176, (2003).

Henzen, A. et al., "Development of Active Matrix Electronic Ink Displays for Smart Handheld Applications", IDW'02, 227 (2002).

Hosaka, H., et al., "Electromagnetic microrelays: concepts and fundamental characteristics", Sensors and Actuators A, 40, 41 (1994).

Jacobson, J., et al., "The last book", IBM Systems J., 36, 457 (1997).

Ji, Y., et al., "P-50: Polymer Walls in Higher-Polymer-Content Bistable Reflective Cholesteric Displays", SID 96 Digest, 611 (1996).

Jin et al., "Optically Transparent, Electrically Conductive Composite Medium", Science, 255, 446 (1992).

Jo, G-R, et al., "Toner Display Based on Particle Movements", Chem. Mater, 14, 664 (2002).

Johnson, M. et al., "High Quality Images on Electronic Paper Displays", SID 05 Digest, 1666 (2005).

Kazlas, P. et al., "Card-size Active-matrix Electronic Ink Display", Eurodisplay 2002, 259 (2002).

Kazlas, P., et al., "12.1" SVGA Microencapsulated Electrophoretic Active Matrix Display for Information Applicances, SID 01 Digest, 152 (Jun. 2001).

Kitamura, T., et al., "Electrical toner movement for electronic paper-like display", Asia Display/IDW '01, p. 1517, Paper HCS1-1 (2001).

Kornfeld, A Defect-Tolerant Active-Matrix Electrophoretic Display, SID Digest, 1984, p. 142.

Lee, L.L., "Fabrication of Magnetic Particles Displays", Proceedings of the SID, 18, 283 (1977).

Moesner, F.M., et al., "Devices for Particle Handling by an AC Electric Field", IEEE, 1995, p. 66.

Murau, P., "Characteristics of an X-Y Addressed Electrophoretic Image Display (EPID)," SID 84 Digest (1984) p. 141.

O'Regan, B. et al., "A Low Cost, High-efficiency Solar Cell Based on Dye-sensitized colloidal $TiO_2$ Films", Nature, vol. 353, Oct. 24, 1991, 773-740.

Pankove, "Color Reflection Type Display Panel", RCA Technical Notes, Mar. 1962, No. 535.

Pearlstein, "Electroless Plating", in Lowenheim (ed.), Modern Electroplating, Wiley, New York (1976), pp. 710-747.

Pitt, M.G., et al., "Power Consumption of Microencapsulated Electrophoretic Displays for Smart Handheld Applications", SID 02 Digest, 1378 (2002).

Quon, W.S., "Multilevel Voltage Select (MLVS): A Novel Technique to X-Y Address an Electrophoretic Display", Correspondence, 1977, pp. 1120-1123.

Saitoh, M., et al., "A newly developed electrical twisting ball display", Proceedings of the SID, 23, 249 (1982).

Sheridon, N.K., et al., "A Photoconductor-Addressed Electrophoretic Cell for Office Data Display", SID 82 Digest, 94 (1982).

Sheridon, N.K., et al., "The Gyricon—A Twisting Ball Display", Proceedings of the SID, 18, 289 (1977).

Shiffman, R.R., et al., "An Electrophoretic Image Display with Internal NMOS Address Logic and Display Drivers," Proceedings of the SID, 1984, vol. 25, 105 (1984).

Shiwa, S., et al., "Electrophoretic Display Method Using Ionographic Technology," SID 88 Digest (1988), p. 61.

Singer, B., et al., "An X-Y Addressable Electrophoretic Display," Proceedings of the SID, 18, 255 (1977).

Vaz, N.A., et al., "Dual-frequency addressing of polymer-dispersed liquid-crystal films", J. Appl. Phys., 65, 5043 (1989).

Vizard, F., :Electric Tales: Computer chips replace wood chips in the pages of 21st century books, Popular Science (1997).

Webber, R., "Image Stability in Active-Matrix Microencapsulated Electrophoretic Displays", SID 02 Digest, 126 (2002).

Whitesides, T. et al., "Towards Video-rate Microencapsulated Dual-Particle Electrophoretic Displays", SID 04 Digest, 133 (2004).

Wood, D., "An Electrochromic Renaissance?" Information Display, 18(3), 24 (Mar. 2002).

Wrighton, M.S. et al., "Photoelectrolysis of Water by Irradiation of Platinized n-Type Semiconducting Metal Oxides," Journal of Solid State Chemistry, 1977, No. 22, pp. 17-19.

Yamaguchi, M., et al., "Equivalent Circuit of Ion Projection-Driven Electrophoretic Display," IEICE Transactions, 74, 4152 (1991).

Yamaguchi, Y., et al., "Toner display using insulative particles charged triboelectrically", Asia Display/IDW '01, p. 1729, Paper AMD4-4 (2001).

Yang, Y., et al., "A new architecture for polymer transistors", Nature, 372, 344 (1994).

Zehner, R. et al., "Drive Waveforms for Active Matrix Electrophoretic Displays", SID 03 Digest, 842 (2003).

* cited by examiner

DIELECTROPHORETIC DISPLAYS

REFERENCE TO RELATED APPLICATIONS

This application is a continuation of application Ser. No. 11/799,377, filed May 1, 2007 (Publication No. 2008/0117495), which is a continuation-in-part of application Ser. No. 10/687,166, filed Oct. 16, 2003 (Publication No. 2004/0136048, now U.S. Pat. No. 7,259,744, issued Aug. 21, 2007), which itself claims benefit of Provisional Application Ser. No. 60/419,019, filed Oct. 16, 2002. The aforementioned application Ser. No. 10/687,166 is also a continuation-in-part of application Ser. No. 08/983,404, filed Mar. 26, 1999 (now U.S. Pat. No. 7,106,296), which is the United States National Phase of International Application No. PCT/US96/12000, filed Jul. 19, 1996, which is itself a continuation-in-part of application Ser. No. 08/504,896, filed Jul. 20, 1995 (now U.S. Pat. No. 6,124,851). The entire disclosure of all the aforementioned applications, and of all U.S. patents and published applications mentioned below, is herein incorporated by reference.

BACKGROUND OF INVENTION

This invention relates to dielectrophoretic displays, and methods for operating such displays. More specifically, this invention relates to dielectrophoretic displays in which solid particles and a suspending fluid are held within a cavity.

Electrophoretic displays have been the subject of intense research and development for a number of years. Such displays use a display medium comprising a plurality of electrically charged particles suspended in a fluid. Electrodes are provided adjacent the display medium so that the charged particles can be moved through the fluid by applying an electric field to the medium. In one type of such electrophoretic display, the medium comprises a single type of particle having one optical characteristic in a fluid which has a different optical characteristic. In a second type of such electrophoretic display, the medium contains two different types of particles differing in at least one optical characteristic and in electrophoretic mobility; the particles may or may not bear charges of opposite polarity. The optical characteristic which is varied is typically color visible to the human eye, but may, alternatively or in addition, be any one of more of reflectivity, retroreflectivity, luminescence, fluorescence, phosphorescence, or (in the case of displays intended for machine reading) color in the broader sense of meaning a difference in absorption or reflectance at non-visible wavelengths.

Electrophoretic displays can be divided into two main types, namely unencapsulated and encapsulated displays. In an unencapsulated electrophoretic display, the electrophoretic medium is present as a bulk liquid, typically in the form of a flat film of the liquid present between two parallel, spaced electrodes. Such unencapsulated displays typically have problems with their long-term image quality which have prevented their widespread usage. For example, particles that make up such electrophoretic displays tend to cluster and settle, resulting in inadequate service-life for these displays.

An encapsulated, electrophoretic display differs from an unencapsulated display in that the particle-containing fluid is not present as a bulk liquid but instead is confined within the walls of a large number of small capsules. Encapsulated displays typically do not suffer from the clustering and settling failure mode of traditional electrophoretic devices and provides further advantages, such as the ability to print or coat the display on a wide variety of flexible and rigid substrates.

For further details regarding encapsulated electrophoretic displays, the reader is referred to U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,271; 6,252,564; 6,262,706; 6,262,833; 6,300,932; 6,312,304; 6,312,971; 6,323,989; 6,327,072; 6,376,828; 6,377,387; 6,392,785; 6,392,786; 6,413,790; 6,422,687; 6,445,374; 6,445,489; 6,459,418; 6,473,072; 6,480,182; 6,498,114; 6,504,524; 6,506,438; 6,512,354; 6,515,649; 6,518,949; 6,521,489; 6,531,997; 6,535,197; 6,538,801; 6,545,291; and 6,580,545; and U.S. Patent Applications Publication Nos. 2002/0019081; 2002/0021270; 2002/0053900; 2002/0060321; 2002/0063661; 2002/0063677; 2002/0090980; 2002/0106847; 2002/0113770; 2002/0130832; 2002/0131147; 2002/0145792; 2002/0171910; 2002/0180687; 2002/0180688; 2002/0185378; 2003/0011560; 2003/0011867; 2003/0011868; 2003/0020844; 2003/0025855; 2003/0034949; 2003/0038755; 2003/0053189; 2003/0076573; 2003/0096113; 2003/0102858; 2003/0132908; 2003/0137521; 2003/0137717; and 2003/0151702; and International Applications Publication Nos. WO 99/67678; WO 00/05704; WO 00/38000; WO 00/38001; WO 00/36560; WO 00/67110; WO 00/67327; WO 01/07961; and WO 01/08241. All of these patents and applications are in the name of, or assigned to, the Massachusetts Institute of Technology (MIT) or E Ink Corporation.

Many of the aforementioned patents and applications recognize that the walls surrounding the discrete microcapsules in an encapsulated electrophoretic medium could be replaced by a continuous phase, thus producing a so-called "polymer-dispersed" electrophoretic display in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, U.S. Pat. No. 6,392,786, at column 6, lines 44-63. See also the aforementioned U.S. Patent Application Publication No. 2002/0131147, and the corresponding International Application PCT/US02/06393 (Publication No. WO 02/075443). Accordingly, for purposes of the present application, such polymer-dispersed electrophoretic media are regarded as sub-species of encapsulated electrophoretic media.

A related type of electrophoretic display is a so-called "microcell electrophoretic display", sometimes also called a "microcup" electrophoretic display. In a microcell electrophoretic display, the charged particles and the suspending fluid are not encapsulated within microcapsules but instead are retained within a plurality of cavities formed within a carrier medium (or substrate), typically a polymeric film. See, for example, International Applications Publication No. WO 02/01281, and published US Application No. 2002/0075556, both assigned to Sipix Imaging, Inc.

Hereinafter, the term "microcavity electrophoretic display" will be used to cover both encapsulated and microcell electrophoretic displays.

One of the problems with electrophoretic displays is the limited range of colors which each pixel of the display can produce. The prior art describes two main types of electrophoretic media. One type comprises a single type of electrically charged particle in a colored medium. This type of medium is only capable of producing two colors at each pixel; either the color of the particles or the color of the medium is seen. The second type of medium comprises two different types of electrically charged particles in an essentially uncolored medium; the two types of particles may differ in polarity of electric charge or have charges of the same polarity but differ in electrophoretic mobility. Again, this type of medium is only capable of producing two colors at each pixel, namely the colors of the two types of particles.

One approach to expanding the limited range of colors available from conventional electrophoretic displays is to place an array of colored filters over the pixels of the display. For example, consider the effect on a display comprising white particles in a black fluid of placing an array of color filters (say red, green and blue) over the individual pixels of the display. Moving the white particles adjacent the viewing surface of a pixel covered with a red filter would color that pixel red, whereas moving the white particles of the same pixel adjacent the rear surface of the display would render the pixel black. The main problem with this approach to generating color is that the brightness of the display is limited by the pixelation of the color filter. For example, if a red color is desired, the pixels covered by red filters are set to appear red, whereas the pixels covered by green and blue filters are set to appear dark, so that only a fraction of the display surface has the desired color while the remaining portion is dark, thus limiting the brightness of any color obtained. A reflective display that was capable of three optical states (black, white and color or black, white and transparent) would render significant advantages in image quality, cost and ease of manufacture.

Conventional electrophoretic displays rely upon movement of electrically charged particles in an electric field under electrostatic forces; the particles move along the lines of force of the electric field. However, it is known that objects can be moved by dielectrophoretic forces, that is to say that dipoles induced in the objects by a non-uniform electric field cause the particles to move towards regions of higher field strength. See, for example, U.S. Pat. No. 4,418,346 to Batchelder which describes an apparatus for providing a dielectrophoretic display of visual information. In this apparatus, a "bubble" of a fluid is moved through a second, immiscible fluid in a stepwise manner by applying voltages to closely spaced electrodes, the bubble being visible against a visually contrasting background. Visual information is conveyed by the position of the bubble relative to the background. The patent suggests that a simple one-dimensional display of this type might represent the level of an analog signal by the position of the bubble. However, since the movement involved is that of a bubble against a contrasting background, such an apparatus does not appear capable of displaying an arbitrary image.

It has now been realized that using a microcavity electrophoretic medium in a dielectrophoretic display greatly simplifies the problem of generating the heterogeneous electric field required by such a display, since differences between the dielectric constant and/or conductivity between the suspending fluid and the material surrounding the suspending fluid (such as a polymeric binder in which the capsules are embedded, as described in many of the aforementioned E Ink and MIT patents and publications, or the substrate in which the cavities of a microcell electrophoretic display are formed) will result in a heterogeneous electric field which can be used to move the particles within the suspending fluid against the side walls of the cavities, thereby providing the display with a substantially transparent state.

SUMMARY OF THE INVENTION

Accordingly, this invention provides a dielectrophoretic display comprising:

a substrate having walls defining at least one cavity, the cavity having a viewing surface and a side wall inclined to the viewing surface;
a suspending fluid contained within the cavity;
a plurality of at least one type of particle suspended within the suspending fluid; and
means for applying to the fluid an electric field effective to cause dielectrophoretic movement of the particles to the side wall of the cavity.

This invention also provides a process for operating a dielectrophoretic display, the process comprising:

providing a substrate having walls defining at least one cavity, the cavity having a viewing surface and a side wall inclined to the viewing surface; a suspending fluid contained within the cavity; and a plurality of at least one type of particle suspended within the suspending fluid; and applying to the fluid an electric field effective to cause dielectrophoretic movement of the particles to the side wall of the cavity.

In the dielectrophoretic display of the present invention, the suspending fluid may be substantially uncolored, and have suspended therein only a single type of particle.

At least some of the at least one type of particle may be electrically charged, and in one form of a display containing such electrically charged particles, the suspending fluid may have suspended therein a first type of particle having a first optical characteristic and a first electrophoretic mobility, and a second type of particle having a second optical characteristic different from the first optical characteristic and a second electrophoretic mobility different from the first electrophoretic mobility. The first and second electrophoretic mobilities may differ in sign, so that the first and second types of particles move in opposed directions in an electric field, and the suspending fluid may be substantially uncolored. This type of display may further comprise a backing member disposed on the opposed side of the cavity from the viewing surface, at least part of the backing member having a third optical characteristic different from the first and second optical characteristics. The backing member may comprise areas having third and fourth optical characteristics different from each other and from the first and second optical characteristics. In preferred forms of such a display, the backing member comprises areas having red, green and blue or yellow, cyan and magenta colors, and the first and second optical characteristics may comprise black and white colors.

In the dielectrophoretic display of the present invention, the cavity may have a non-circular cross-section, preferably a polygonal cross-section, as seen from the viewing surface. The at least one type of particle may be formed from an electrically conductive material, for example a metal, carbon black or a doped semiconductor.

As already indicated, in the dielectrophoretic display of the present invention, the substrate may comprises at least one capsule wall (typically a deformable wall) so that the dielectrophoretic display comprises at least one capsule. For reasons explained in the aforementioned 2003/0137717, the capsules are preferably arranged in a single layer. Alternatively, the substrate may comprise a continuous phase surrounding a plurality of discrete droplets of the suspending fluid having the at least one type of particle suspended therein (i.e., the display may be of the polymer-dispersed type), or may comprises a substantially rigid material having the at least one cavity formed therein, the substrate further comprising at least one cover member closing the at least one cavity, so that the display is of the microcell type.

In the process of the present invention, the electric field may be an alternating electric field. When the display is of the type in which at least some of the at least one type of particle are electrically charged, and the suspending fluid has suspended therein a first type of particle having a first optical characteristic and a first electrophoretic mobility, and a second type of particle having a second optical characteristic different from the first optical characteristic and a second electrophoretic mobility different from the first electrophoretic mobility, with the first and second electrophoretic mobilities differing in sign, so that the first and second types of particles move in opposed directions in an electric field, the process may further comprise:

applying an electric field of a first polarity to the cavity, thereby causing the first type of particles to approach the viewing surface and the cavity to display the first optical characteristic at the viewing surface; and applying an electric field of a polarity opposite to the first polarity to the cavity, thereby causing the second type of particles to approach the viewing surface and the cavity to display the second optical characteristic at the viewing surface.

This invention also provides a dielectrophoretic display comprising:

a substrate having walls defining at least one cavity, the cavity having a viewing surface and a side wall inclined to the viewing surface;

a fluid contained within the cavity;

a plurality of at least one type of electrically charged particle within the fluid, the particles having a first optical characteristic;

a backing member disposed on the opposed side of the cavity from the viewing surface, at least part of the backing member having a second optical characteristic different from the first optical characteristics, the backing member being light-transmissive; and means for applying to the substrate an electric field effective to cause dielectrophoretic movement of the particles to the side wall of the cavity.

In one form of such a dielectrophoretic display, the fluid is substantially uncolored, and has therein only a single type of particle. The cavity may have a non-circular (and preferably polygonal) cross-section as seen from the viewing surface. The single type of particle may be formed from an electrically conductive material, for example a metal or carbon black. Alternatively, the single type of particle may be formed from a doped semiconductor.

The substrate may comprise at least one capsule wall so that the dielectrophoretic display comprises at least one capsule. The display may comprise a plurality of capsules, the capsules being arranged in a single layer. Alternatively, the substrate may comprise a continuous phase surrounding a plurality of discrete droplets of the fluid having the particles therein. In another form of such a dielectrophoretic display, the substrate comprises a substantially rigid material having the at least one cavity formed therein, the substrate further comprising at least one cover member closing the at least one cavity.

The dielectrophoretic display may be arranged to have light projected on to a surface on the opposed side of the dielectrophoretic display from the viewing surface. The invention extends to a variable transmission window comprising a dielectrophoretic display of the invention.

This invention also provides a process for operating a dielectrophoretic display, the process comprising:

providing a substrate having walls defining at least one cavity, the cavity having a viewing surface and a side wall inclined to the viewing surface, a fluid contained within the cavity; and a plurality of at least one type of electrically charged particle suspended within the suspending fluid, the particles having a first optical characteristic; and a backing member disposed on the opposed side of the cavity from the viewing surface, at least part of the backing member having a second optical characteristic different from the first optical characteristic, the backing member being light-transmissive; and applying to the substrate an electric field effective to cause dielectrophoretic movement of the particles to the side wall of the cavity.

In this process, the electric field may be an alternating electric field. The fluid may be substantially uncolored and have therein only a single type of particle. This single type of particle may be formed from an electrically conductive material, for example a metal or carbon black. Alternatively, the single type of particle may be formed from a doped semiconductor. The substrate may comprise at least one capsule wall so that the dielectrophoretic display comprises at least one capsule. The display may comprise a plurality of capsules, the capsules being arranged in a single layer. Alternatively, the substrate may comprise a continuous phase surrounding a plurality of discrete droplets of the fluid having the particles therein. In another form of such a dielectrophoretic display, the substrate comprises a substantially rigid material having the at least one cavity formed therein, the substrate further comprising at least one cover member closing the at least one cavity.

This invention also provides an electronically addressable display comprising a microencapsulated display medium including a first species having a higher dielectric constant and a second species having a lower dielectric constant; and electrodes disposed adjacent the display medium for selectively creating regions of higher and lower electric field; and wherein the first species moves toward the region of higher electric field.

In such an electronically addressable display, the display medium may comprise a bichromal microsphere having a first hemisphere and a second hemisphere differing in dielectric constants, wherein the first species of higher dielectric constant comprises the first hemisphere and the second species of lower dielectric constant comprises the second hemisphere. Alternatively, the display medium may comprise a first species of colored particles having a higher dielectric constant and a second species of colored particles having a lower dielectric constant. The first species may have a dielectric constant that is permanently higher than that of the second species. The first species may move in translational migration.

This invention also provides a process for operating a dielectrophoretic display, the process comprising:

providing a substrate having walls defining at least one cavity, the cavity having a viewing surface and a side wall inclined to the viewing surface, a fluid contained within the cavity; and a plurality of solid particles within the fluid, the particles having a dielectric constant higher than the dielectric constant of the fluid; and applying to the substrate a non-homogeneous electric field, the electric field being greater adjacent the side wall than in the center of the cavity, thereby causing the particles to move to the side wall of the cavity.

This invention also provides a process for operating a dielectrophoretic display, the process comprising:

providing a substrate having walls defining at least one cavity, the cavity having a viewing surface and a side wall inclined to the viewing surface, a fluid contained within the cavity; and a plurality of solid particles within the fluid, the particles having a dielectric constant lower than the dielectric constant of the fluid; and applying to the substrate a non-homogeneous electric field, the electric field being smaller adjacent the side wall than in the center of the cavity, thereby causing the particles to move to the side wall of the cavity.

DETAILED DESCRIPTION

Figure 1:
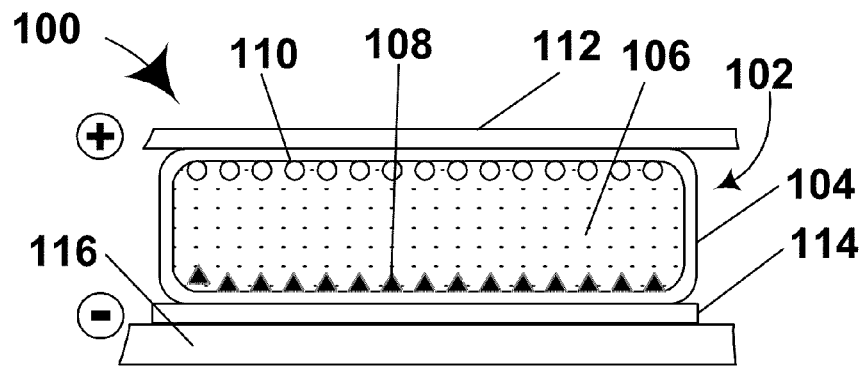
FIG. 1 of the accompanying drawings is a schematic section showing a white opaque state of a dielectrophoretic display of the present invention.

As already mentioned, in one aspect this invention provides a dielectrophoretic display comprising a substrate having walls defining at least one cavity, the cavity having a viewing surface and a side wall inclined to the viewing surface; a suspending fluid contained within the cavity; a plurality of at least one type of particle suspended within the suspending fluid; and means for applying to the fluid an electric field effective to cause dielectrophoretic movement of the particles to the side wall of the cavity.

References to "viewing surface" and "side wall" herein do not imply that these surfaces are perpendicular to each other, though a substantially perpendicular arrangement of the two surfaces is preferred, since when the particles are disposed adjacent the side wall of the cavity, such a perpendicular arrangement minimizes the area of the viewing surface occupied by the particles, and hence permits the maximum amount of light to pass through the cavity. The side wall or walls of the cavity also need not be planar; for example, an encapsulated display of the present invention may use capsules as described in the aforementioned U.S. Pat. No. 6,067,185 having the form of "flattened spheres" (i.e., oblate ellipsoids) with curved side walls.

In this display, it is necessary that there be a difference between the dielectric constant and/or conductivity of the suspending fluid and that of the substrate to provide the heterogeneous electric field necessary for dielectrophoresis. Desirably, this difference should be made as large as possible. It may also be advantageous to use a capsule which has a non-circular, and preferably polygonal, cross-section perpendicular to the direction of the applied electric field since sharply curved regions or corners of the capsule produce increased field heterogeneity and thus assist the dielectrophoretic movement of the particles.

Those skilled in the technology of electrophoretic displays will appreciate that both electrically neutral and electrically charged particles can be moved by dielectrophoresis, since dielectrophoretic movement is dependent upon dipoles induced in the particles by the electric field and not upon any pre-existing charge on the particles. However, it appears advantageous to use electrically charged particles in the apparatus and process of the present invention since once the particles have been moved to the side wall of the capsule by dielectrophoresis, it appears desirable to use normal electrophoretic movement of the particles to disperse them; it will be appreciated that since the heterogeneity of the electric field in an encapsulated display is due to differences between the properties of the suspending fluid on the one hand and the capsule wall and surrounding material on the other, there will normally be no way of reversing the high field and low field regions in a manner similar to that used in the Batchelder apparatus, so that if the particle movement caused by dielectrophoresis is to be reversed, some applied force other than dielectrophoresis must be used.

If electrically charged particles are used in the present apparatus and process, the particles are of course subject to both electrophoretic and dielectrophoretic forces when an electric field is applied. Typically, electrophoretic movement of particles will be much more rapid than dielectrophoretic, so that to ensure that the desired dielectrophoretic movement is not subject to interference from electrophoretic movement, it is desirable to reverse the electric field at intervals; provided the field is applied for the same amount time in each direction, the electrophoretic movements will sum to zero, since electrophoretic movement is polarity-sensitive, whereas the dielectrophoretic movements will not sum to zero since dielectrophoretic movement is polarity-independent.

The dielectrophoretic movement of the particles in the apparatus and process of the present invention is affected by the material from which the particles are formed, and the size and shape of the particles. Since dielectrophoresis depends upon the induction of dipoles within the particles, it is desirable to use particles which are highly polarizable, especially conductive particles such as metals. For example, aluminum particles may be used in the present invention. It has been observed experimentally that carbon black particles, which have a reasonably high conductivity, have substantially greater dielectrophoretic mobility than substantially non-conductive titania particles. The particles may also be formed from a doped semiconductor; the type of doping is not critical provided that the particles have sufficient conductivity, but most undoped semiconductors have too low a conductivity to have high dielectrophoretic mobility.

The induced dipole, and hence the dielectrophoretic movement of the particles, is also affected by the size and shape of the particles. Since a large particle allows greater separation between the poles of a dipole than a smaller particle, increasing the size of the particles will increase dielectrophoretic mobility, although of course the particles should not be made so large as to readily visible when they lie adjacent the side wall of the capsule. For similar reasons, elongate particles, especially needle-shaped particles, will tend to have a higher dielectrophoretic mobility than spherical particles of the same volume. Anisotropically shaped particles may also be useful in the present invention.

There are two main variations of the apparatus and process of the present invention. In the first variation, the cavity contains only a single type of particle in an uncolored suspending fluid. This capsule can be switched between an "opaque" state, in which the particles are dispersed throughout the suspending fluid, and a "transparent" state, in which the particles are moved to a side wall of the capsule so that light can pass through the uncolored suspending fluid. The transparent state need not appear transparent to a viewer; as illustrated in the drawings and as described in more detail below, a reflector or filter having a color different from that of the particles may be placed on the opposed side of the capsule from the viewing surface thereof, so that in the transparent state a viewer sees the color of the reflector or filter; in the opaque state the color of the reflector or filter is of course hidden by the dispersed particles.

In the second variation, the capsules contain two different types of particles differing in at least one optical characteristic and in electrophoretic mobility and a suspending fluid which may be colored or uncolored. This capsule can be switched among three states, namely a first opaque state, in which the first type of particles are visible, a second opaque state, in which the second type of particles are visible, and a "transparent" state, in which both types of particles are moved to a side wall of the capsule by dielectrophoresis and the color of the suspending fluid is visible; if, as will typically be the case, the suspending fluid is uncolored, the transparent state is actually transparent and may be used to display the color of a reflector or filter disposed on the opposed side of the capsule from the viewing surface thereof, as previously described.

It will be appreciated that, provided that the desired color can be seen when a display of the present invention is in a transparent state, the location of the colored material is essentially irrelevant. Thus, although reference has been made above to a reflector or filter, it is not essential that this reflector or filter be a discrete integer, and color could be provided in any convenient location. Thus, for example, the colored reflector or filter could be provided by coloring (a) the substrate itself, for example the polymeric film used in a microcell form of the present display; (b) a material associated with the substrate, for example a polymeric binder used to retain capsules in a coherent layer in an encapsulated display of the invention, or a lamination adhesive layer used to secure the dielectrophoretic layer to a backplane; or (c) the pixel electrodes or another component of a backplane used to drive the display. In principle, in an encapsulated display color could be provided by dyeing the capsule walls themselves, but this does have the disadvantage that in an opaque state of a pixel the color in the portion of the capsule adjacent the viewing surface will affect the color seen at that surface when the pixel is in an opaque state. In some cases, the resultant color shift may be acceptable, or may be minimized, for example by using particles which have a color complementary to that of the color caused by the capsule wall. In other cases, color may be provided only on the parts of the capsule wall lying on the opposed side of the capsule to the viewing surface, for example by providing a radiation-sensitive color-forming material in the capsule wall and then exposing this color-forming material to radiation effective to bring about the formation of color, this radiation being directed on to the capsule from the side of the display opposite to the viewing surface.

Color could also be provided from a source separate from the display itself. For example, if a display of the present invention is arranged to operate as a light valve and backlit by projecting light on to a surface on the opposed side of the display from the viewing surface, color could be provided by imaging an appropriate color filter on to the rear surface of the display.

Except in cases where it is essential that the colored member be light transmissive, the color may be provided either by dyes or pigments, although the latter are generally preferred since they are typically more stable against prolonged exposure to radiation, and thus tend to provide displays with longer operating lifetimes.

As already indicated, no special electrode configurations are required in the display and process of the present invention; the invention can be practiced with simple parallel electrodes on opposed sides of the cavity; for example, a multi-pixel display of the invention using at least one cavity per pixel could have the conventional electrode configuration of a single pixel electrode for each pixel on one side of the cavities and a single common electrode extending across all the pixels on the opposed side of the cavities. However, this invention does not exclude the possibility that the electrodes might be shaped to enhance the dielectrophoretic effect. It may also be useful to use so-called "z-axis adhesives" (i.e., adhesives having a substantially greater conductivity parallel to the thickness of a layer of adhesive than in the plane of this layer) between one or both of the electrodes and the cavities cf. copending Application Ser. No. 60/319,934, filed Feb. 11, 2003, the entire disclosure of which is herein incorporated by reference. In addition, as discussed in detail below with reference to the drawings, in some embodiments of the invention it may be advantageous to provide auxiliary electrodes to assist in redispersing the particles in the suspending fluid after the particles have be driven to the side walls by dielectrophoresis.

As already mentioned, there are three principal types of dielectrophoretic displays of the present invention. The first type is the "classical" encapsulated electrophoretic type as described in the aforementioned E Ink and MIT patents and applications. In this type of display, the substrate has the form of at least one capsule wall, which is typically deformable, and formed by depositing a film-forming material around a droplet containing the suspending fluid and the dielectrophoretic particles. The second type is the polymer-dispersed electrophoretic type in which the substrate comprises a continuous phase surrounding a plurality of discrete droplets of the suspending fluid. Full details regarding the preparation of this type of display are given in the aforementioned 2002/0131147. The third type is the microcell display, in which a plurality of cavities or recesses are formed in a substrate, filled with the suspending fluid and particles and then sealed, either by lamination a cover sheet over the recesses or by polymerizing a polymerizable species also present in the suspending fluid.

Figure 2:
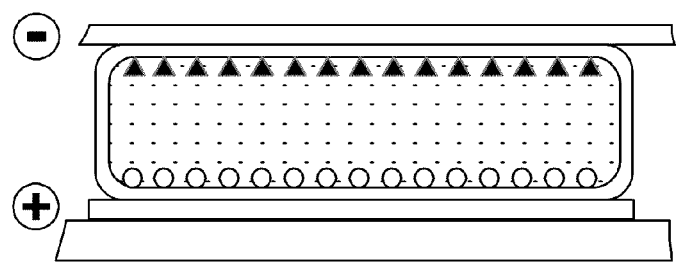
FIG. 2 is a schematic section similar to FIG. 1 but showing a black opaque state of the display shown in FIG. 1.
Figure 3:
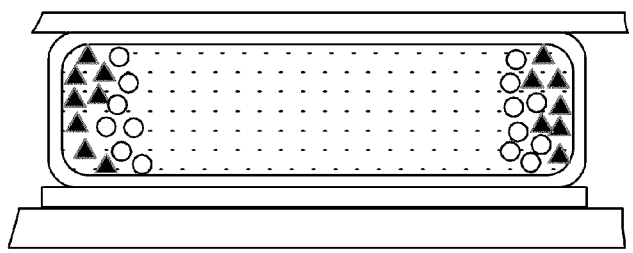
FIG. 3 is a schematic section similar to FIGS. 1 and 2 but showing a transparent state of the display shown in FIGS. 1 and 2.

The first dielectrophoretic display (generally designated 100) of the invention shown in FIGS. 1 to 3 comprises an encapsulated dielectrophoretic medium (generally designated 102) comprising a plurality of capsules 104 (only one of which is shown in FIGS. 1 to 3), each of which contains a suspending liquid 106 and dispersed therein a plurality of a first type of particle 108, which for purposes of illustration will be assumed to be black. The particles 108 are electrophoretically mobile and may be formed of carbon black. In the following description, it will be assumed that the particles 108 are positively charged, although of course negatively charged particles could also be used if desired. Also suspended in the suspending liquid 106 is a plurality of a second type of particle 110, which is electrophoretically mobile and negatively charged, and may be formed of titania. (The triangular shape of the particles 108, and the circular shape of the particles 110 are used purely to way of illustration to enable the various types of particles to be distinguished easily in the accompanying drawings, and in no way correspond to the physical forms of the actual particles, which are typically substantially spherical. However, we do not exclude the use of non-spherical particles in the present displays.) The display 100 further comprises a common, transparent front electrode 112, which forms a viewing surface through which an observer views the display 100, and a plurality of discrete rear electrodes 114, each of which defines one pixel of the display 100 (only one rear electrode 114 is shown in FIGS. 1 to 3). (The front electrode 112 is typically provided on a support member which also provides mechanical protection for the display 100 but for simplicity this support member is omitted from FIGS. 1 to 3.) For ease of illustration and comprehension, FIGS. 1 to 3 show only a single microcapsule forming the pixel defined by rear electrode 114, although in practice a large number (20 or more) microcapsules are normally used for each pixel. The rear electrodes 114 are mounted upon a substrate 116, which contains areas of differing color, as described in more detail below with reference to FIGS. 4 to 8.

Typically the liquid 106 is uncolored (i.e., essentially transparent), although some color may be present therein to adjust the optical properties of the various states of the display. FIG. 1 shows the display 100 with the front electrode 112 positively charged relative to the rear electrode 114 of the illustrated pixel. The positively charged particles 108 are held electrostatically adjacent the rear electrode 114, while the negatively charged particles 110 are held electrostatically against the front electrode 112. Accordingly, an observer viewing the display 100 through the front electrode 112 sees a white pixel, since the white particles 110 are visible and hide the black particles 108.

FIG. 2 shows the display 100 with the front electrode 112 negatively charged relative to the rear electrode 114 of the illustrated pixel. The positively charged particles 108 are now electrostatically attracted to the negative front electrode 112, while the negatively charged particles 110 are electrostatically attracted to the positive rear electrode 114. Accordingly, the particles 108 move adjacent the front electrode 112, and the pixel displays the black color of the particles 108, which hide the white particles 110.

FIG. 3 shows the display 100 after application of an alternating electric field between the front and rear electrodes 112 and 114 respectively. The application of the alternating electric field causes dielectrophoretic movement of both types of particles 108 and 110 to the side walls of the capsule 104, thus leaving the major portion of the area of the capsule 104 essentially transparent. Accordingly, the pixel displays the color of the substrate 116.

To redisperse the particles 108 and 110 uniformly throughout the suspending liquid 106 from their positions shown in FIG. 3, a series of short direct current voltages of alternating polarity is applied between the front and rear electrodes 112 and 114, thereby causing the particles 108 and 110 to oscillate within the suspending liquid 106; this oscillation causes the particles 108 and 110 to gradually redisperse throughout the liquid 106. Application of a longer direct current pulse of appropriate polarity will then cause the pixel to assume the state shown in FIG. 1 or 2 depending upon the polarity of the longer pulse.

In FIGS. 1 to 3, the capsules 104 are illustrated as being of substantially prismatic form, having a width (parallel to the planes of the electrodes) significantly greater than their height (perpendicular to these planes). This prismatic shape of the capsules 104 is deliberate since it provides the capsules with side walls which extend essentially perpendicular to the viewing surface of the display, thus minimizing the proportion of the area of the capsule 104 which is occupied by the particles 108 and 110 in the transparent state shown in FIG. 3. Also, if the capsules 104 were essentially spherical, in the black state shown in FIG. 2, the particles 108 would tend to gather in the highest part of the capsule, in a limited area centered directly above the center of the capsule. The color seen by the observer would then be essentially the average of this central black area and a white or colored annulus surrounding this central area, where either the white particles 110 or the substrate 116 would be visible. Thus, even in this supposedly black state, the observer would see a grayish color rather than a pure black, and the contrast between the two extreme optical states of the pixel would be correspondingly limited. In contrast, with the prismatic form of microcapsule shown in FIGS. 1 and 2, the particles 108 cover essentially the entire cross-section of the capsule so that no, or at least very little, white or other colored area is visible, and the contrast between the extreme optical states of the capsule is enhanced. For further discussion on this point, and on the desirability of achieving close-packing of the capsules within the electrophoretic layer, the reader is referred to the aforementioned U.S. Pat. No. 6,067,185. Also, as described in the aforementioned E Ink and MIT patents and applications, to provide mechanical integrity to the dielectrophoretic medium, the capsules 104 are normally embedded within a solid binder, but this binder is omitted from FIGS. 1 to 3 for ease of illustration.

Figure 4:
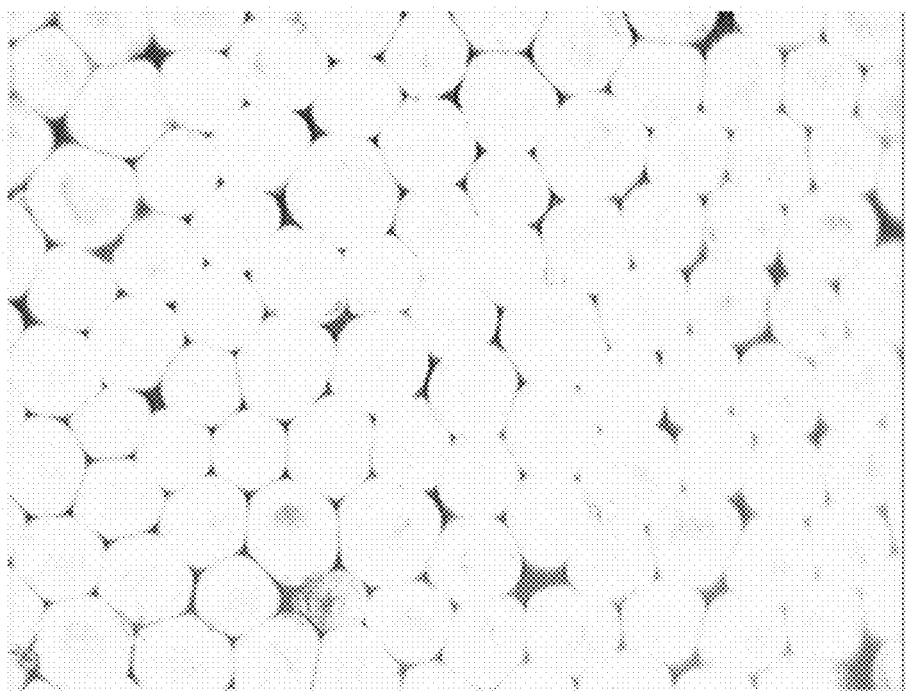
FIGS. 4 to 6 are top plan views through the viewing surface of an experimental display in the states corresponding to FIGS. 1 to 3 respectively.
Figure 5:
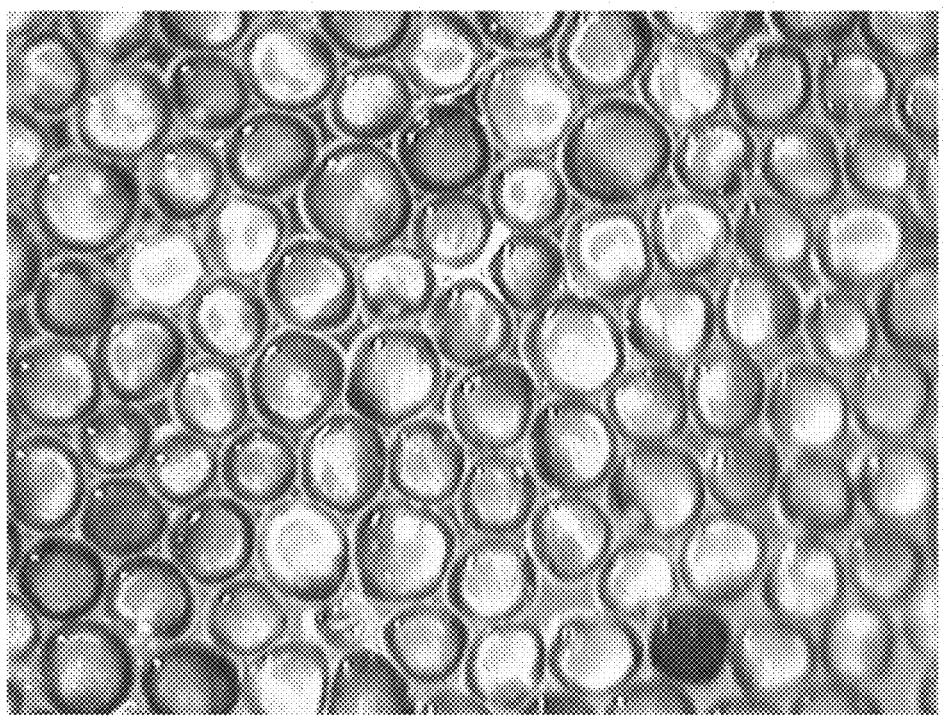
Figure 6:
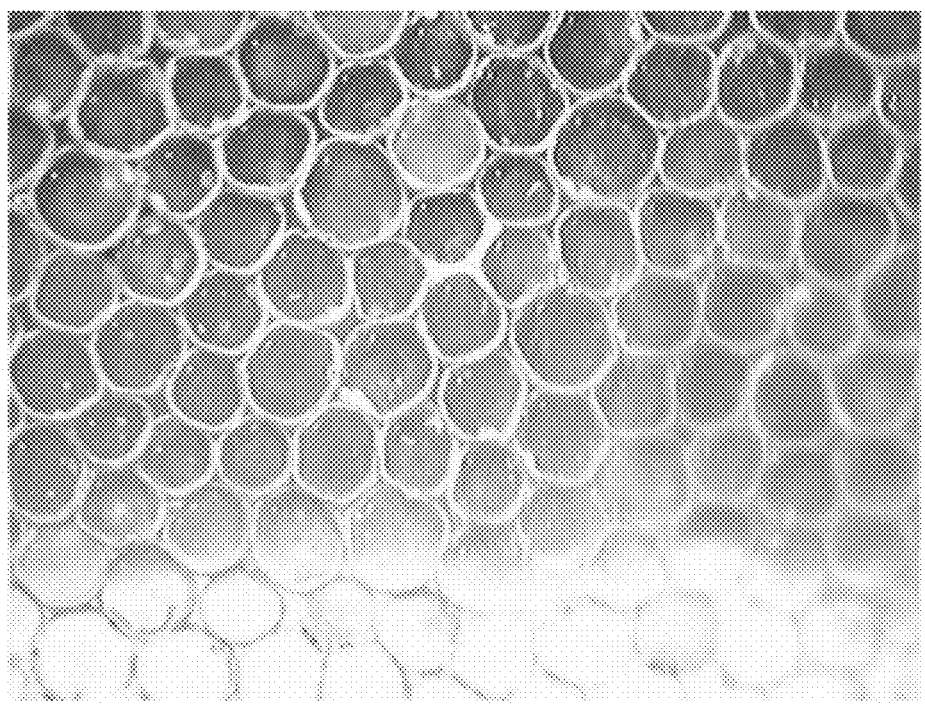

FIGS. 4, 5 and 6 of the accompanying drawings illustrate the white opaque, black opaque and transparent optical states of an experimental display of the present invention substantially as described above with reference to FIGS. 1 to 3 and comprising a plurality of capsules, each of which contains carbon black and white titania particles bearing charges of opposite polarity in a colorless suspending fluid. The display was prepared substantially as described in the aforementioned 2003/0137717 by encapsulating a hydrocarbon suspending fluid containing the carbon black and titania particles in a gelatin/acacia capsule wall, mixing the resultant capsules with a polymeric binder, coating the capsule/binder mixture on to an indium tin oxide (ITO) coated surface of a polymeric film to provide a single layer of capsules covering the film, and laminating the resultant film to a backplane. For purposes of illustration, the display shown in FIGS. 4, 5 and 6 was formed as a single pixel with the transparent front electrode forming the viewing surface of the display, and the backplane (actually a single rear electrode) disposed adjacent a multi-colored reflector.

FIG. 4 shows the display in its first, white opaque state corresponding to that of FIG. 1, with the white particles moved by electrophoresis and lying adjacent the viewing surface of the display, so that the white particles hide both the black particles and the multicolored reflector, and the display appears white. Similarly, FIG. 5 shows the display in its second, black opaque state corresponding to that of FIG. 2, with the black particles moved by electrophoresis and lying adjacent the viewing surface of the display, so that the black particles hide both the white particles and the multicolored reflector, and the display appears black. FIG. 6 shows the display in a transparent state corresponding to that of FIG. 3 caused by applying a square wave with a frequency of 60 Hz and an amplitude of 90V until no further change was visible in the display (approximately 150 seconds). The application of this square wave caused both the black and white particles to move dielectrophoretically to the side walls of the capsules, thus causing the multicolored reflector to be visible through the uncolored suspending fluid. Thus, a display of the type shown in FIGS. 1 to 6 can display three different colors, which eases the problems of building a full color electro-optic display.

Figure 7:
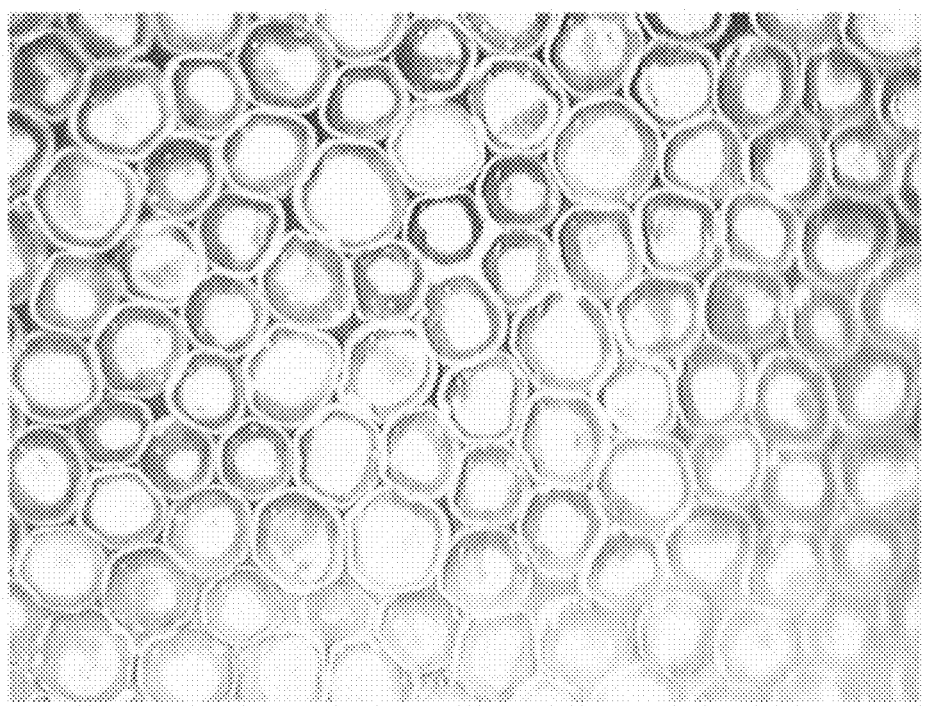
FIGS. 7 and 8 illustrate the transition from the white optical state of the display shown in FIG. 4 to the transparent state shown in FIG. 6.
Figure 8:
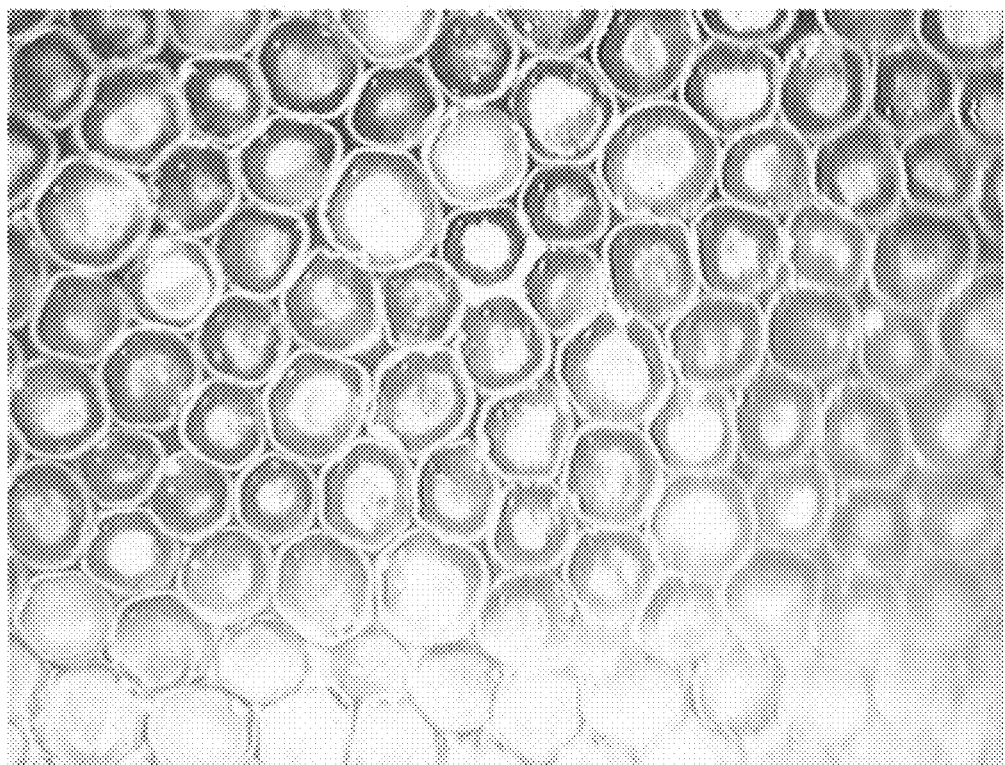

FIGS. 7 and 8 illustrate the transition from the white opaque state shown in FIG. 4 to the transparent state shown in FIG. 6; FIG. 7 shows the display after application of the aforementioned square wave for 10 seconds, while FIG. 8 shows the display after application of the square wave for 30 seconds. It will be seen from FIGS. 6, 7 and 8 that development of the transparent state occurs gradually as more and more particles are moved to the side walls of the capsules. In FIG. 7, the multicolored reflector is just becoming visible, while in FIG. 8 this reflector is more visible but much less clear than in the final transparent state shown in FIG. 6.

Figure 9:
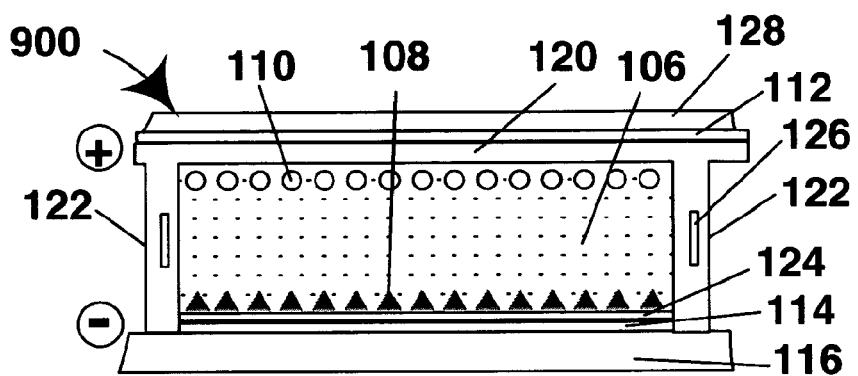
FIGS. 9 to 11 are schematic sections through a microcell display of the present invention in states corresponding to those of FIGS. 1 to 3 respectively.
Figure 10:
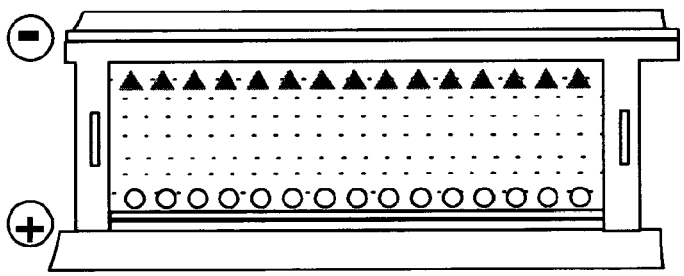
Figure 11:
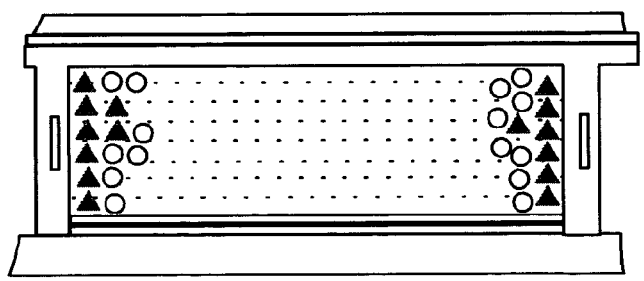

FIGS. 9 to 11 show schematic sections, similar to those of FIGS. 1 to 3 respectively, of one pixel of a microcell display (generally designated 900) of the present invention. The microcell display 900 uses essentially the same dielectrophoretic medium, comprising a suspending liquid 106 with carbon black particles 108 and white titania particles suspended therein, as the encapsulated display 100 shown in FIGS. 1 to 3; however, the form of substrate used in the display 900 differs substantially from that of the display 100. In the display 900, the substrate comprises a base member 120 and a plurality of side walls 122 extending perpendicular to the base member 120 and forming a plurality of microcells in which are confined the liquid 106 and the particles 108 and 110. The lower faces (as illustrated in FIGS. 9 to 11) of the microcells are closed by closure walls 124, which are formed by radiation polymerization of a polymerizable species originally present in the liquid 106; see the aforementioned International Application Publication No. WO 02/01281, and published US Application No. 2002/0075556. The display 900 further comprises a front electrode 112, a rear or pixel electrode 114 and a colored substrate 116 all of which are essentially identical to the corresponding integers in FIG. 1. (In the same way as in FIGS. 1 to 3, for simplicity FIGS. 9 to 11 are drawn as if there is only a single microcell to the pixel defined by the electrode 114 although in practice a single pixel may comprise multiple microcells.) The display 900 also comprises auxiliary electrodes embedded within the side walls 122 and a protective layer 126 covering the front electrode 112.

As shown in FIGS. 9 to 11, the microcell display 900 operates in a manner very similar to the encapsulated display 100 shown in FIGS. 1 to 3. FIG. 9 shows the display 900 with the front electrode 112 positively charged relative to the rear electrode 114 of the illustrated pixel. The positively charged particles 108 are held electrostatically adjacent the rear electrode 114, while the negatively charged particles 110 are held electrostatically against the front electrode 112. Accordingly, an observer viewing the display 100 through the front electrode 112 sees a white pixel, since the white particles 110 are visible and hide the black particles 108.

FIG. 10 shows the display 900 with the front electrode 112 negatively charged relative to the rear electrode 114 of the illustrated pixel. The positively charged particles 108 are now electrostatically attracted to the negative front electrode 112, while the negatively charged particles 110 are electrostatically attracted to the positive rear electrode 114. Accordingly, the particles 108 move adjacent the front electrode 112, and the pixel displays the black color of the particles 108, which hide the white particles 110.

FIG. 11 shows the display 900 after application of an alternating electric field between the front and rear electrodes 112 and 114 respectively. The application of the alternating electric field causes dielectrophoretic movement of both types of particles 108 and 110 to the side walls of the microcell, thus leaving the major portion of the area of the microcell essentially transparent. Accordingly, the pixel displays the color of the substrate 116.

Redispersion of the particles 108 and 110 from the transparent state of the display 900 shown in FIG. 11 may be effected in the same way as described above for the display 100. However, the auxiliary electrodes 126 are provided to assist in such redispersion. The auxiliary electrodes run the full width of the display (which is assumed to be perpendicular to the plane of FIGS. 9 to 11), i.e., each auxiliary electrode is associated with a full row of microcells, and the auxiliary electrodes are connected to a voltage source which, when activated, applies voltages of opposed polarities to alternate auxiliary electrodes 126. By applying a series of voltage pulses of alternating polarity to the auxiliary electrodes 126, an electric field is created in the left-right direction in FIGS. 9 to 11, which greatly assists is redispersing all the particles 108 and 110 throughout the display uniformly within the liquid 106. Voltage pulses of alternating polarity may also be applied to the electrodes 112 and 114 as previously described to further assist in redispersing the particles 108 and 110.

FIGS. 12A-12D illustrate electronically addressable contrast media (i.e., dielectrophoretic displays) of the present invention which are addressed by electrodes disposed only on the rear surface (i.e., the surface remote from the viewing surface) of the display. In these displays, as described in Application Ser. No. 60/022,222 (see also U.S. Pat. No. 6,120,588, which issued on application Ser. No. 08/935,800, filed Sep. 23, 1997, which is effect the completion of Application Ser. No. 60/022,222), the dielectrophoretic effect is employed to cause a species (particle) of higher dielectric constant to move to a region of higher field strength.

Figures 12A, 12B:
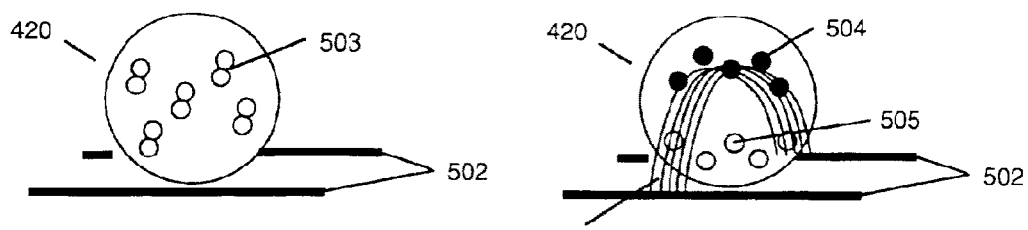
FIGS. 12A to 12D are schematic details of dielectrophoretic switched electronically addressed contrast media of the present invention.

In FIGS. 12A and 12B, a capsule 420 contains a non-colored dye solvent complex 503. a pair of electrodes 502 are disposed adjacent the rear (non-viewing) surface of the capsule 420. (In all of FIGS. 12A-12D, as in FIGS. 1-3 and 9-11, it is assumed that the display is to be viewed from above as illustrated.) The complex 503 is stable when no field is applied across the pair of electrodes 502. However, when an electric field 506 is applied across the pair of electrodes 502, as illustrated in FIG. 12B, the complex 503 dissociates into a colored dye component 504 and a solvent component 505, with the dye component 504 moving away from the electrodes 502 towards a region of lower electric field.

Figure 12C:
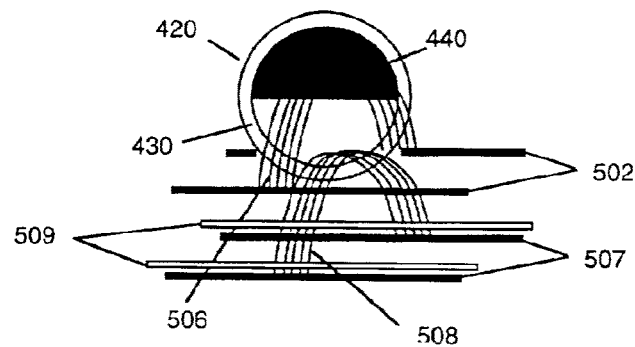
Figure 12D:
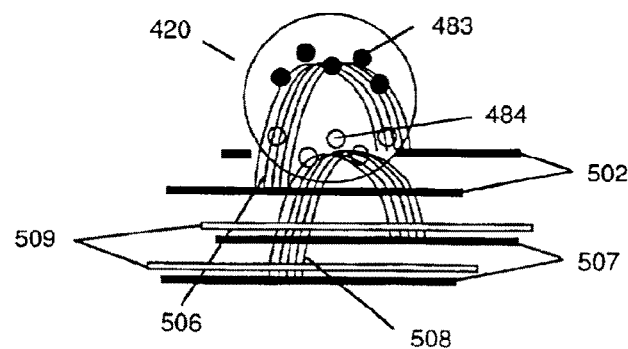

FIGS. 12C and 12D illustrate electronically addressable contrast media similar to that illustrated in FIGS. 12A and 12B but using two pairs of stacked electrodes 502, 507 in place of the single pair of electrodes 502 illustrated in FIGS. 12A and 12B. The presence of the two pairs of stacked electrodes 502, 507 allows for creation of a high field region in higher 506 or a lower 508 plane, thus causing a species of higher dielectric constant to migrate to a higher or lower region respectively. In FIG. 12C, the species of higher dielectric constant is one hemisphere 440 of a bichromal sphere, this sphere having a second hemisphere 430 of lower dielectric constant than the hemisphere 440. In FIG. 12D, the species of higher dielectric constant is one species 483 of a mixture of colored species 483, 484. In both cases, the separation of the species gives the effect of differing color states. FIGS. 12C and 12D further illustrate the use of shaped material 509, which may be dielectric or conducting materials, to shape the electric fields from the electrodes 502, 507.

It will be appreciated that other electronically addressable contrast media may readily be substituted for those shown in FIGS. 12A-12D.

It will be appreciated that the present invention need not make use of a colored reflector behind the capsules but may be used to provide backlit displays, variable transmission windows and transparent displays; indeed, the present invention may be useful in any application where light modulation is desired.

It is appropriate to give some consideration to the problems involved in driving dielectrophoretic displays. The basic physical principles of dielectrophoresis are discussed below and semi-quantitative predictions are derived from a simple model. This model also relates physical and electrical properties of the components of the dielectrophoretic medium to the strength of the dielectrophoretic force.

An object of charge q in an external electric field Le experiences a force:

$$F=qE_e \quad (1)$$

The external field does not include the field arising from the charged object under consideration (i.e., $E_e=E-E_{self}$), since according to Newton's Laws one cannot pull oneself up by one's own bootstraps. It is advantageous to express Equation (1) in terms of potentials. The potential for force is the potential energy W $$F=-\nabla W \quad (2)$$

and the potential for the electric field is the electrostatic potential $\phi$ $$E_e=-\nabla\phi_e \quad (3)$$

Accordingly, Equation (1) above can be re-written as:

$$W=q\phi_e \quad (4)$$

For any general object with a charge density function $\rho(r)$ there are forces beyond the electrophoretic term owing to the distributed nature of the charge distribution. To realize this, it is necessary to begin by recognizing that the total electrostatic potential energy is simply the sum of all the possible electrostatic energy terms calculated as the same manner as in Equation (4) above:

$$W = \int_S \rho(r)\phi_e(r)\,dr \quad (5)$$

where the integral is over the charge distribution of the object under consideration. This energy can be broken up into recognizable components by expressing the electrostatic potential as a Taylor expansion about a suitable origin:

$$\phi_e(r) = \phi_e(0) + r\cdot\nabla\phi_e(0) + \frac{1}{2}\sum\sum r_i r_j \frac{\partial^2\phi}{\partial r_i \partial r_j} + \ldots \quad (6)$$

Substituting Equation (6) into Equation (5) gives:

$$W = q\phi_e(0) - p\cdot E(0) - \frac{1}{6}\sum\sum Q_{ij}\frac{\partial E_j}{\partial r_i}(0) + \ldots \quad (7)$$

where q is the electric monopole:

$$q = \int_S \rho(r)\,dr \quad (8)$$

p is the electric dipole moment:

$$p = \int_S \rho(r)r\,dr \quad (9)$$

and $Q_{ij}$ represents the components of the electric quadrupole tensor.

Equation (3) is used in the derivation of Equation (7), which shows how the various moments of the charge distribution interact with the various electric field terms. The monopole couples to the electrostatic potential, the dipole to the field (gradient or first derivative of the potential), the quadrupole to the field gradient (second derivative of the potential) etc. From the expression for electrostatic energy in Equation (7), the forces and torques on charged bodies in an external field can be determined. The translational force is determined by taking the negative gradient of Equation (7). The electrophoretic force is the first order term in the Taylor expansion, the dielectrophoretic force is the second term in the same expansion, and higher order terms represent additional forces which are not relevant for purposes of the present invention. The first term of the expansion gives the electrophoretic force already expressed by Equation (1). The second term is the dielectrophoretic force, $F_{DEP}$, between a dipole and a field gradient:

$$F_{DEP}=p\cdot\nabla E_e \quad (10)$$

Figure 13:
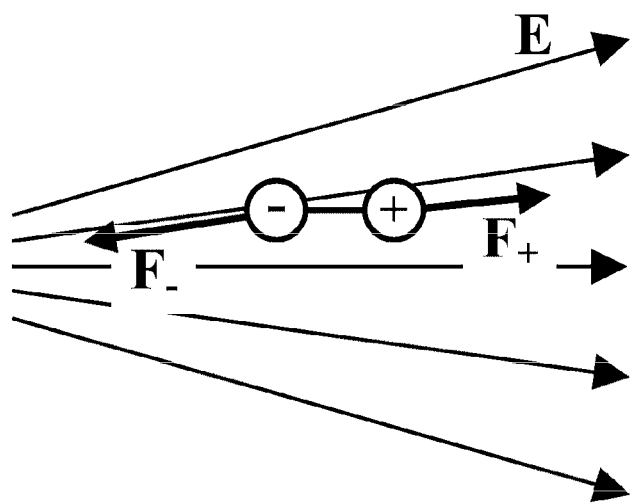
FIG. 13 illustrates the forces acting on a dipole in a non-uniform electric field.

Thus, a dipole does not feel a force in a uniform electric field, but rather a field gradient is required to exert force a dipole; see FIG. 13. In FIG. 13, If the electric field were uniform, the forces $F_-$ and $F_+$ on the two parts of the dipole would cancel to give zero net force. Because the two charges that comprise the dipole are at different positions and experience different fields, the forces do not completely cancel. The resultant force is the dielectrophoretic force on the dipole. The third term of Equation (7) shows that a quadrupole charge distribution does not experience a force in a uniform field or in a uniform field gradient, but will experience a force due to the derivative of the field gradient.

Equation (10) shows that a dipole experiences a force in the direction of increasing field strength. In other words, dipoles are attracted to regions of high electric field strength. For example, a charged air-gap capacitor will attract dielectric media, the dielectric media being polarized by the electric field in the capacitor gap.

The next step in modeling a dielectrophoretic display is to consider the dielectrophoretic force on a polarizable particle lying within a fluid medium. The particle typically has no electric dipole except that induced by an external field. In such an external field, the particle is polarized, and has an induced dipole moment that can be acted on by a field gradient. Consider a particle with a complex dielectric constant $\epsilon^*_p$ immersed in a fluid with a complex dielectric constant $\epsilon^*_m$. Each complex dielectric constant is expressed in terms of the real dielectric constant, a conductivity $\sigma$, and the frequency of the sinusoidally varying external field $\omega$:

$$\varepsilon^* = \varepsilon - j\frac{\sigma}{\omega} \quad (11)$$

An applied electric field of the form:

$$E=E_0 e^{j\omega t} \quad (12)$$

polarizes the fluid and the particle. The important parameter when considering dielectrophoresis is the difference between the dipole moment of the particle and the same volume of the fluid. The excess dipole moment is given by the Clausius-Mosotti relation:

$$p = 4\pi \epsilon_m a^3 K(\omega) E \quad (13)$$

where $\epsilon_m$ is the dielectric constant of the fluid, a the radius of the particle (assumed to be spherical) and $K(\omega)$ is the difference between the complex dielectric constant of the particle ($\epsilon^*_p$) and that of the fluid ($\epsilon^*_m$), weighted according to the effect of field gathering:

$$K(\omega) = \frac{\varepsilon^*_p - \varepsilon^*_m}{\varepsilon^*_p + 2\varepsilon^*_m} \quad (14)$$

The dielectrophoretic force on the particle, using Equation (10) and taking the real component of a complex quantity, is:

$$F_{DEP} = Re\{p \cdot \nabla E_e\} = Re\{4\pi \epsilon_m a^3 K(\omega) E \cdot \nabla E\} \quad (15)$$

This can be transformed to give the time average dielectric force in the sinusoidal external field:

$$F_{DEP} = 2\pi \epsilon_m a^3 Re\{K(\omega)\} \nabla (E_{rms})^2 \quad (16)$$

where $E_{rms}$ is the root-mean-square electric field strength.

There are two major cases of interest in connection with dielectrophoretic displays, namely that of an insulating particle in an insulating fluid, and of a conducting particle in an insulating fluid, and these two cases are considered separately below.

A. Insulating Particle in an Insulating Fluid

In principle, all materials act as insulators at sufficiently high frequencies and as conductors at sufficiently low frequencies. Materials normally considered to be insulators may be conductive in the 1 MHz range, and sometimes at far lower frequencies, while materials normally considered to be conductors may act as insulators at very high frequencies, perhaps in the MHz or GHz range or above. A cross-over frequency can be defined as the frequency at which the conductive and non-conductive components of the complex dielectric function of Equation (11) are equal, and conductive and conductive and insulating regimes can be defined as follows:

Conductive regime: $\omega << (\pi/\epsilon)$ (17A)

Insulating regime: $\omega >> (\sigma/\epsilon)$ (17B).

When a (solid) particle is immersed in a fluid, in general the cross-over frequencies of the particle and the fluid will be different, so that there will be a frequency range where one of the particle and the fluid acts as an insulating dielectric material, whereas the other component acts as a conductor. Within the insulating regime, the contrast function defined by Equation (11) above can be approximated by:

$$K(\omega) = \frac{\varepsilon_p - \varepsilon_m}{\varepsilon_p + 2\varepsilon_m} \quad (18)$$

From this Equation, it will be seen that if the particle has a dielectric constant that exceeds that of the fluid it will be attracted to high-field regions, whereas if the particle has a dielectric constant less than that of the fluid it will be attracted to low-field regions.

Figure 14:
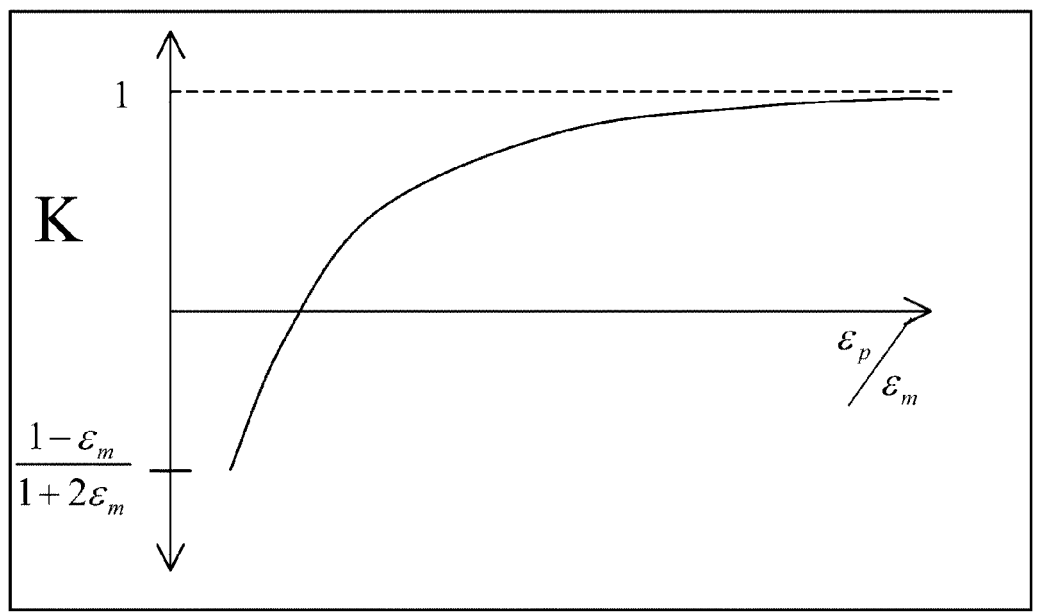
FIG. 14 is a graph illustrating the variation of the contrast function with the ratio of the dielectric constants of the particle and the fluid for an insulating particle in an insulating fluid.

FIG. 14 is a graph showing the variation of the contrast function, as calculated from Equation (18), as a function of $\epsilon_p/\epsilon_m$. From FIG. 14, it will be seen that the contrast function increases monotonically with $\epsilon_p/\epsilon_m$, and is bounded by unity.

B. Conducting Particle in an Insulating Fluid

If, at the applied field frequency, the particle acts as a conductor, the imaginary component of its dielectric constant is much greater than the real component, and hence:

$$\epsilon_p^* \approx -j\sigma/\omega \quad (19)$$

Assuming that the surrounding fluid acts as an insulator, the magnitude of the particle's dielectric constant far exceeds the magnitude of the fluid's dielectric constant, $K(\omega)$ approaches unity, and the dielectrophoretic force is given by:

$$F_{DEP} = 2\pi \epsilon_m a^3 \nabla (E_{rms})^2 \quad (20)$$

Equation (20) shows that the dielectrophoretic force on a conducting particle in an insulating fluid always exceeds the dielectrophoretic force on an insulating particle. To take one practical example, the aforementioned E Ink and MIT patents and applications disclose electrophoretic media comprising carbon black and titania particles in an insulating hydrocarbon fluid. If such media are operated in a dielectrophoretic mode, the dielectrophoretic force on the carbon black particles exceeds the dielectrophoretic force on the titania particles for otherwise similar conditions.

Finally, a simple model of the dielectrophoretic behavior of an encapsulated electrophoretic medium of the general type shown in FIGS. 1-3 will be considered. Inhomogeneities in the electrophoretic layer, for example those due to differences between the fluid and the capsule walls, induce field gradients. A full analysis of this problem would require numerical field calculations, but in order to develop a first approximation about the magnitude and direction of the field gradients in such an electrophoretic layer, we consider a very simple model for the field distribution throughout a capsule by making the approximation that the electric field divides itself locally between the external components (the capsule wall and any polymeric binder, which is typically present between the capsules and serves to bind them into a mechanically coherent layer) and the internal phase (the fluid and the particles therein) in the same manner as a vertical stack of these materials with no lateral variations in geometry. This crude approximation neglects lateral field components and is expected to be particularly poor near the vertical edges of the capsules, as illustrated in FIGS. 1-3. Using this vertical stack model, the electric field in the internal phase is given by:

$$E_{IP} = \frac{1 + \frac{d_e}{d_{IP}}}{1 + \frac{\varepsilon^*_{IP}}{\varepsilon^*_e} \frac{d_e}{d_{IP}}} E_0 \quad (21)$$

where $E_0$ is the applied voltage, V, divided by the thickness, d, of the electrophoretic layer, i.e.:

$$E_0 = V/d \quad (22)$$

$d_e$ is the local thickness of the external phase, $d_{IP}$ is the local thickness of the internal phase, $\epsilon_{IP}^*$ and $\epsilon_e^*$ are the complex dielectric constants of the internal and external phases. In this model, gradients in the electric field within the internal phase arise from variations in the local fraction of external phase and the difference in dielectric constant or conductivity between the internal and external phases. Also, gradients in $E^2$ are in the plane of the substrates and point outwardly (or inwardly) along a capsule's radial direction. Typically, the external phase of an encapsulated electrophoretic medium is more conductive and has a larger dielectric constant than the internal phase. In such a medium, the electric field in the internal phase is largest in regions where the capsule is thinnest, which will be along the lateral perimeter of the capsules (i.e., the left and right hand edges of the capsules as illustrated in FIGS. 1-3), or in the case of tightly packed capsules, at the surfaces of contact with neighboring capsules.

Typically, in an encapsulated electrophoretic medium, the electrophoretic particles have a larger polarizability than the fluid, and so their dielectrophoretic mobility will be positive. The particles will thus be attracted to the thinnest regions of the capsules along the lateral extremes of the capsules and especially to the vertices of the capsules.

Consider the application of an alternating voltage to the electrophoretic medium. The electrophoretic force, $F_{ep}$, acting on the particles is typically sinusoidal:

$$F_{ep} \sim \sin \omega t \tag{23}$$

and averages to zero. The dielectrophoretic force, $F_{dep}$, is proportional to the square of the electric field, so its temporal variation is:

$$F_{dep} \sim \sin^2 \omega t \tag{24}$$

which has a non-zero average. Use of a high frequency alternating voltage will induce small amplitude oscillations due to the electrophoretic force and a sinusoidally-modulated but linearly-directed motion due to the dielectrophoretic force. The total velocity of a particle is given by the sum of the electrophoretic and dielectrophoretic motions:

$$v = v_{ep} + v_{dep} \tag{25}$$

where:

$$v_{ep} \sim \mu_{ep} E_0 \sin \omega t \tag{26}$$

and:

$$v_{dep} \sim \mu_{dep} \nabla (E_{rms}^2) \sin^2 \omega t \tag{27}$$

where $\mu_{dep}$ is the dielectrophoretic mobility, which can be derived from Equation (16) and the standard formula for the drag force, $F_{drag}$, on a particle in a viscous fluid:

$$F_{drag} = 6\pi\mu a v \tag{27A}$$

From Equations (16) and (27A):

$$\mu_{dep} = \frac{\varepsilon_m a^2 \text{Re}\{K(\omega)\}}{3\mu} \tag{28}$$

As mentioned above, the time-averaged migration of the particles will be toward the outer lateral edges of the capsules, and especially toward the vertices of the capsules in this direction.

The timescale for such dielectrophoretic motion can be estimated in the following manner. The gradient in the mean square electric field is approximately the difference in the mean square field between the capsule center and the edges, divided by the lateral radius of the capsule. The field at the center of the capsule is approximately:

$$E_{IP,center} = \frac{1 + \frac{H - h_c}{h_c}}{1 + \frac{\varepsilon_{IP}^*}{\varepsilon_e^*} \frac{H - h_c}{h_c}} E_0 \tag{29}$$

where H is the ink thickness and $h_c$ is the height of the internal phase at capsule center. At the lateral edge of the capsule, the thickness of the internal phase goes to zero and the field at the internal phase goes to:

$$E_{IP,edge} = \frac{\varepsilon_e^*}{\varepsilon_{IP}^*} E_0 \tag{30}$$

The gradient in the mean square field can be approximated by:

$$\nabla(E^2) = \frac{E_0^2}{a_c} \left[ \left( \frac{1 + \frac{H - h_c}{h_c}}{1 + \frac{\varepsilon_{IP}^*}{\varepsilon_e^*} \frac{H - h_c}{h_c}} \right)^2 - \left( \frac{\varepsilon_e^*}{\varepsilon_{IP}^*} \right)^2 \right] \tag{31}$$

where $a_c$ is the lateral radius of the capsule.

It should be noted that since practical encapsulated electrophoretic media are composites of several components, the electric field across any of the components will be a function of the electrical behavior of all the other components. For example, over short time scales, differences in dielectric constants between the various components will cause electric field lines to be bent, concentrated, or rarified in various regions. Over time scales longer than ohmic relaxation times, conductivity variations will determine these effects.

Those skilled in the display art will appreciate that numerous changes, improvements and modifications can be made in the preferred embodiments of the invention already described without departing from the scope of the invention. Accordingly, the whole of the foregoing description is intended to be construed in an illustrative and not in a limitative sense.

The invention claimed is:

1. A display comprising:
a substrate having walls defining at least one cavity, the cavity having a viewing surface and a side wall inclined to the viewing surface;
a fluid contained within the cavity;
a plurality of at least one type of electrically charged solid particle within the fluid; and
means for applying to the fluid an electric field effective to cause movement of the particles to the side wall of the cavity.

2. A process for operating a display, the process comprising:
providing a substrate having walls defining at least one cavity, the cavity having a viewing surface and a side wall inclined to the viewing surface; a fluid contained within the cavity;
and a plurality of at least one type of electrically charged solid particle within the fluid; and
applying to the fluid an electric field effective to cause movement of the solid particles to the side wall of the cavity.

3. A display comprising:
a substrate having walls defining at least one cavity, the cavity having a viewing surface and a side wall inclined to the viewing surface;
a fluid contained within the cavity;
a plurality of at least one type of electrically charged solid particle within the fluid, the solid particles having a first optical characteristic;
a backing member disposed on the opposed side of the cavity from the viewing surface, at least part of the backing member having a second optical characteristic different from the first optical characteristics, the backing member being light-transmissive; and means for applying to the substrate an electric field effective to cause movement of the solid particles to the side wall of the cavity.

4. A display according to claim 3 wherein the cavity has a non-circular cross-section as seen from the viewing surface.

5. A display according to claim 4 wherein the cavity has a polygonal cross-section as seen from the viewing surface.

6. A display according to claim 3 having a single type of solid particle formed from an electrically conductive material.

7. A display according to claim 6 wherein the single type of solid particle is formed from a metal or carbon black.

8. A display according to claim 3 having a single type of solid particle formed from a doped semiconductor.

9. A display according to claim 3 wherein the substrate comprises at least one capsule wall so that the display comprises at least one capsule.

10. A display according to claim 9 comprising a plurality of capsules, the capsules being arranged in a single layer.

11. A display according to claim 3 wherein the substrate comprises a continuous phase surrounding a plurality of discrete droplets of the fluid having the at least one type of solid particle therein.

12. A display according to claim 3 wherein the substrate comprises a substantially rigid material having the at least one cavity formed therein, the substrate further comprising at least one cover member closing the at least one cavity.

13. A display according to claim 3 arranged to have light projected on to a surface on the opposed side of the display from the viewing surface.

14. A process for operating a display, the process comprising:
providing a substrate having walls defining at least one cavity, the cavity having a viewing surface and a side wall inclined to the viewing surface, a fluid contained within the cavity;
and a plurality of at least one type of electrically charged solid particle within the fluid, the particles having a first optical characteristic; and a backing member disposed on the opposed side of the cavity from the viewing surface, at least part of the backing member having a second optical characteristic different from the first optical characteristic, the backing member being light-transmissive; and
applying to the substrate an electric field effective to cause movement of the solid particles to the side wall of the cavity.

15. A process according to claim 14 wherein the electric field is an alternating electric field.

16. A process according to claim 14 having only a single type of solid particle formed from an electrically conductive material.

17. A process according to claim 16 wherein the electrically conductive material is a metal or carbon black.

18. A process according to claim 14 having only a single type of solid particle formed from a doped semiconductor.

19. A process according to claim 14 wherein the substrate comprises at least one capsule wall so that the display comprises at least one capsule.

20. A process according to claim 19 wherein the substrate comprises a plurality of capsules, the capsules being arranged in a single layer.

21. A process according to claim 14 wherein the substrate comprises a continuous phase surrounding a plurality of discrete droplets of the fluid having the solid particles suspended therein.

22. A process according to claim 14 wherein the substrate comprises a substantially rigid material having the at least one cavity formed therein, the substrate further comprising at least one cover member closing the at least one cavity.

23. A process for operating a display, the process comprising:
providing a substrate having walls defining at least one cavity, the cavity having a viewing surface and a side wall inclined to the viewing surface, a fluid contained within the cavity;
and a plurality of solid particles within the fluid, the particles having a dielectric constant higher than the dielectric constant of the fluid; and
applying to the substrate a non-homogeneous electric field, the electric field being greater adjacent the side wall than in the center of the cavity, thereby causing the particles to move to the side wall of the cavity.

24. A process for operating a display, the process comprising:
providing a substrate having walls defining at least one cavity, the cavity having a viewing surface and a side wall inclined to the viewing surface, a fluid contained within the cavity; and a plurality of solid particles within the fluid, the particles having a dielectric constant lower than the dielectric constant of the fluid; and
applying to the substrate a non-homogeneous electric field, the electric field being smaller adjacent the side wall than in the center of the cavity, thereby causing the solid particles to move to the side wall of the cavity.

25. A display comprising:
a substrate having walls defining at least one cavity, the cavity having a viewing surface, a rear surface on the opposed side of the cavity from the viewing surface, and a side wall extending between the viewing surface and the rear surface;
a fluid contained within the cavity;
a plurality of at least one type of electrically charged solid particle within the fluid;
a front electrode adjacent the viewing surface of the cavity;
a rear electrode adjacent the rear surface; and
a side electrode adjacent the side wall,
the display having a first optical state in which the solid particles lie adjacent the front electrode, a second optical state in which the solid particles lie adjacent the rear electrode and a third optical state in which the solid particles lie adjacent the side electrode.

26. A display comprising:
a substrate having walls defining at least one cavity, the cavity having a viewing surface, a rear surface on the opposed side of the cavity from the viewing surface, and a side wall extending between the viewing surface and the rear surface;
a fluid contained within the cavity;
a plurality of at least one type of electrically charged solid particle within the fluid;
a front electrode adjacent the viewing surface of the cavity;
a rear electrode adjacent the rear surface; and
a side electrode adjacent the side wall,
the display having a first optical state in which the solid particles lie adjacent the viewing surface, a second optical state in which the solid particles lie adjacent the rear surface and a third optical state in which the solid particles lie adjacent the side wall.

* * * * *